US012628325B2

(12) United States Patent　　　　　(10) Patent No.: US 12,628,325 B2

Takahashi et al.　　　　　　　　　　　(45) Date of Patent: May 12, 2026

(54) MANUFACTURING SYSTEM, MANUFACTURING METHOD, CONTROL SYSTEM, AND CONTROL METHOD

(71) Applicant: Panasonic Intellectual Property Management Co., Ltd., Osaka (JP)

(72) Inventors: Junichi Takahashi, Osaka (JP); Nobuyuki Kakishima, Yamanashi (JP); Yasuyuki Ishitani, Yamanashi (JP); Ryosuke Murai, Osaka (JP); Hikari Kurihara, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 509 days.

(21) Appl. No.: 18/006,022

(22) PCT Filed: Jul. 5, 2021

(86) PCT No.: PCT/JP2021/025240

§ 371 (c)(1),
(2) Date: Jan. 19, 2023

(87) PCT Pub. No.: WO2022/024676

PCT Pub. Date: Feb. 3, 2022

(65) Prior Publication Data

US 2023/0292481 A1　　Sep. 14, 2023

(30) Foreign Application Priority Data

Jul. 31, 2020　(JP) ................................. 2020-131103

(51) Int. Cl.
B23P 19/00　　　(2006.01)
H05K 13/02　　　(2006.01)
(Continued)

(52) U.S. Cl.
CPC ....... *H05K 13/0404* (2013.01); *H05K 13/021* (2013.01); *H05K 13/0434* (2013.01);
(Continued)

(58) Field of Classification Search
CPC ............... G05B 19/418; H05K 13/021; H05K 13/0404; H05K 13/0434; H05K 13/082;
(Continued)

(56) References Cited

U.S. PATENT DOCUMENTS 7,613,617 B2 * 11/2009 Williams ............... G06Q 50/08
　　　　　　　　　　　　　　　　　　　705/1.1
8,880,416 B2 * 11/2014 Williams ......... G06Q 10/06311
　　　　　　　　　　　　　　　　　　　705/1.1
(Continued)

FOREIGN PATENT DOCUMENTS

JP　　　H07-176892 A　　7/1995
JP　　　2005-353847 A　　12/2005
(Continued)

OTHER PUBLICATIONS

International Search Report issued in Patent Application No. PCT/JP2021/025240 dated Sep. 7, 2021.

*Primary Examiner* — Paul D Kim
(74) *Attorney, Agent, or Firm* — McDonald Hopkins LLC

(57)　　　　　　ABSTRACT

A manufacturing system according to the present disclosure includes one or more manufacturing apparatuses, a carrier, and a control system. Each of the one or more manufacturing apparatuses performs predetermined work on a board. The carrier carries a burden. The control system controls carrying work by the carrier. The burden includes a plurality of functional modules. Each of the plurality of functional modules provides a predetermined function for the one or more manufacturing apparatuses. The carrier includes a coupling portion to be coupled to any of the plurality of
(Continued)

functional modules. The control system has at least one functional module, selected from the plurality of functional modules and coupled to the coupling portion, carried by the carrier.

14 Claims, 13 Drawing Sheets

(51) Int. Cl.
    *H05K 13/04*         (2006.01)
    *H05K 13/08*         (2006.01)
(52) U.S. Cl.
    CPC ....... *H05K 13/082* (2018.08); *H05K 13/0882* (2018.08); *H05K 13/0895* (2018.08)
(58) Field of Classification Search
    CPC .............. H05K 13/085; H05K 13/086; H05K 13/0882; H05K 13/0895; Y02P 90/02
    See application file for complete search history.

(56) References Cited

U.S. PATENT DOCUMENTS

| | | | |
|---|---|---|---|
| 2008/0059340 A1* | 3/2008 | McCaherty | G06Q 10/087 |
| | | | 705/28 |
| 2015/0073589 A1 | 3/2015 | Khodl et al. | |
| 2021/0064008 A1 | 3/2021 | Ao | |

FOREIGN PATENT DOCUMENTS

| | | |
|---|---|---|
| JP | 2018-018416 A | 2/2018 |
| JP | 2019-061311 A | 4/2019 |
| JP | 2019-091771 A | 6/2019 |
| WO | 2019/159319 A1 | 8/2019 |

* cited by examiner

MANUFACTURING SYSTEM, MANUFACTURING METHOD, CONTROL SYSTEM, AND CONTROL METHOD

TECHNICAL FIELD

The present disclosure generally relates to a manufacturing system, a manufacturing method, a control system, and a control method. More particularly, the present disclosure relates to a manufacturing system, a manufacturing method, a control system, and a control method, all of which are configured or designed to carry a burden to a manufacturing apparatus.

BACKGROUND ART

Patent Literature 1 discloses a mounter for mounting parts onto a printed circuit board. This mounter includes a parts loader which carries, as a burden, a parts feeding unit, on which the parts to be mounted have been set in place in advance, from a parts storeroom to a parts feeding station. When the parts feeding unit is carried to the parts feeding station, the mounter starts performing the mounting operation of mounting, onto the printed circuit board, the parts that have been set in place on the parts feeding unit.

The mounting line (manufacturing system) for mounting parts onto the printed circuit board includes not only the mounter but also a printer for printing solder onto the board and other devices. To have the work of feeding necessary materials (such as solder and masks) to the printer done automatically, another carrier needs to be provided.

CITATION LIST

Patent Literature

Patent Literature 1: JP H07-176892 A

SUMMARY OF INVENTION

An object of the present disclosure is to provide a manufacturing system, a manufacturing method, a control system, and a control method, all of which are configured or designed to reduce the number of carriers to be used by the manufacturing system.

A manufacturing system according to an aspect of the present disclosure includes one or more manufacturing apparatuses, a carrier, and a control system. The one or more manufacturing apparatuses each perform predetermined work on a board. The carrier carries a burden. The control system controls carrying work by the carrier. The burden includes a plurality of functional modules. Each of the plurality of functional modules provides a predetermined function for the one or more manufacturing apparatuses. The carrier includes a coupling portion to be coupled to any of the plurality of functional modules. The control system has at least one functional module, selected from the plurality of functional modules and coupled to the coupling portion, carried by the carrier.

A manufacturing method according to another aspect of the present disclosure includes a coupling step and a carrying step. The coupling step includes coupling at least one functional module, selected from a plurality of functional modules, to a carrier. Each of the plurality of functional modules provides a predetermined function for one or more manufacturing apparatuses. Each of the one or more manufacturing apparatuses performs predetermined work on a board. The carrying step includes making the carrier carry the at least one functional module selected from the plurality of functional modules and coupled to the carrier.

A control system according to still another aspect of the present disclosure includes a selection unit and a carrying instruction unit. The selection unit selects at least one functional module as a burden. The at least one functional module is selected from a plurality of functional modules. Each of the plurality of functional modules provides a predetermined function for one or more manufacturing apparatuses. The one or more manufacturing apparatuses each perform predetermined work on a board. The carrying instruction unit outputs a carry instruction, instructing that the burden be carried, to the carrier.

A control method according to yet another aspect of the present disclosure includes a selecting step and a carrying instructing step. The selecting step includes selecting, from a plurality of functional modules, at least one functional module as a burden. Each of the plurality of functional modules provides a predetermined function for one or more manufacturing apparatuses. The one or more manufacturing apparatuses each perform predetermined work on a board. The carrying instructing step includes outputting a carry instruction, instructing that the burden be carried, to the carrier.

BRIEF DESCRIPTION OF DRAWINGS

FIG. 6 is a perspective view illustrating a state where the carrier is carrying a parts feeding module;

FIG. 7 is a perspective view illustrating a state where the carrier is carrying a tray feeding module;

FIG. 8 is a perspective view illustrating a state where the carrier is carrying a collective exchange module;

DESCRIPTION OF EMBODIMENTS

Embodiment (1) Overview

Figure 1:
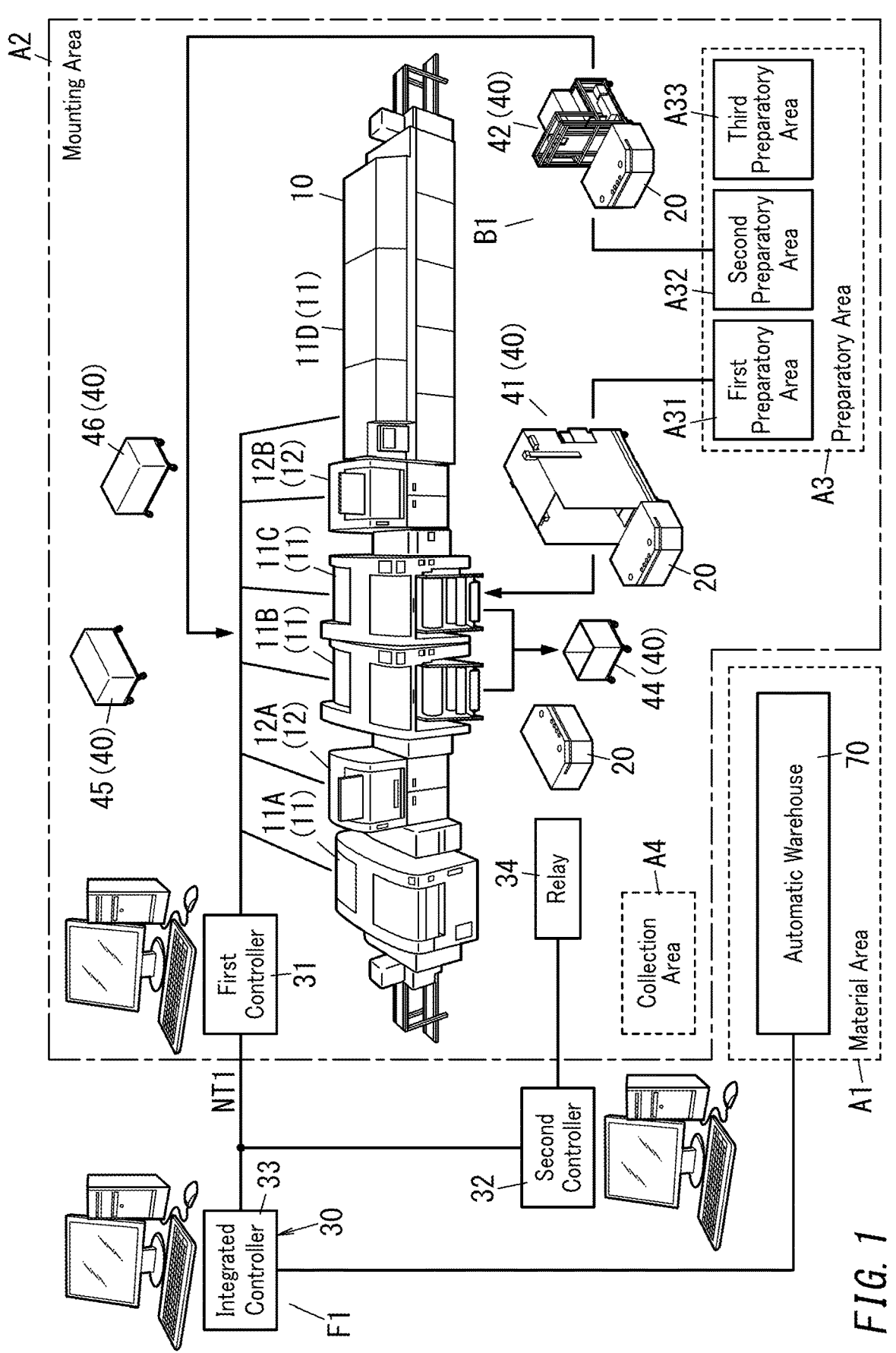
FIG. 1 illustrates a schematic system configuration for a manufacturing system according to an exemplary embodiment of the present disclosure.
Figure 2:
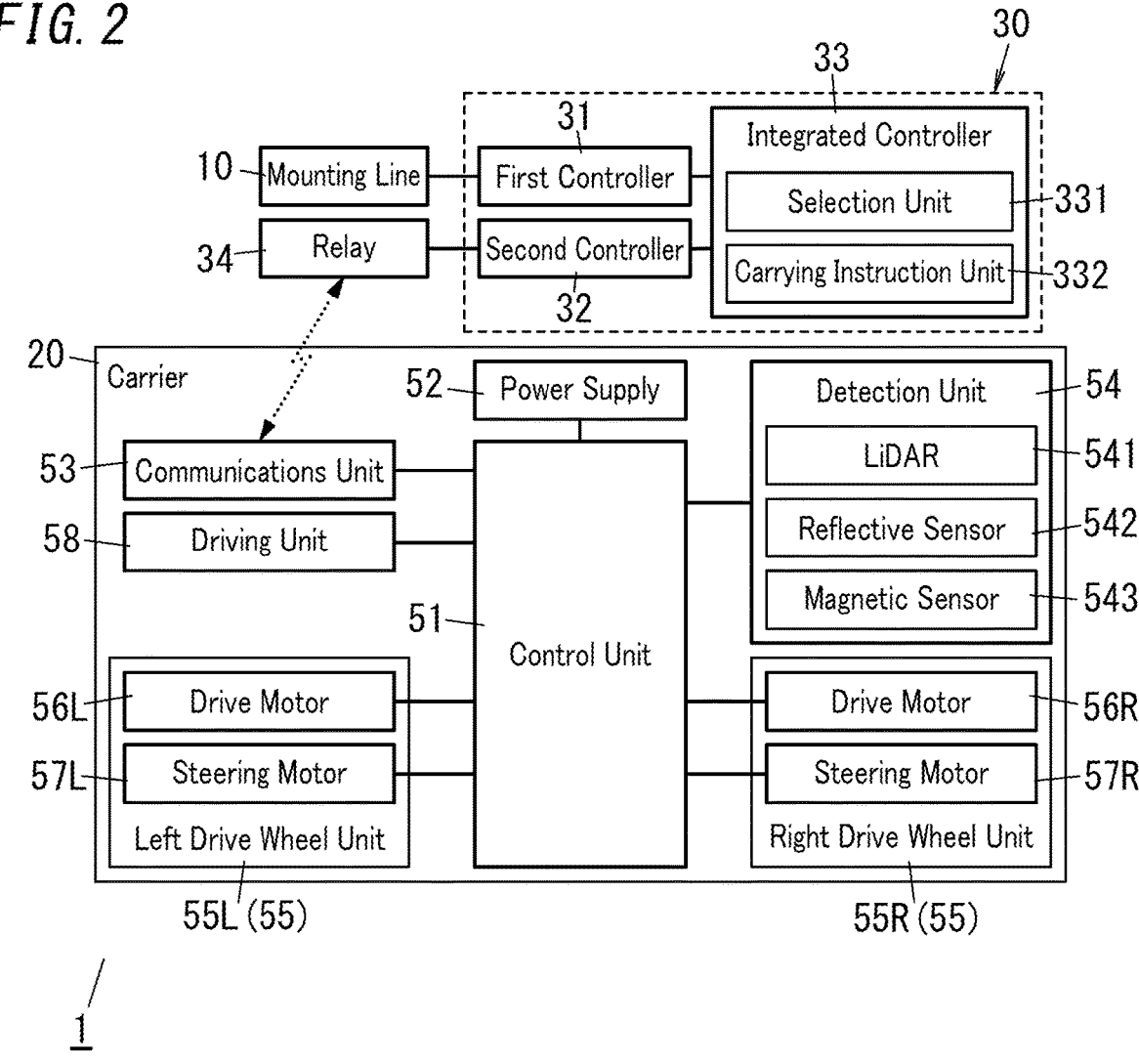
FIG. 2 is a schematic block diagram of the manufacturing system.
Figure 4:
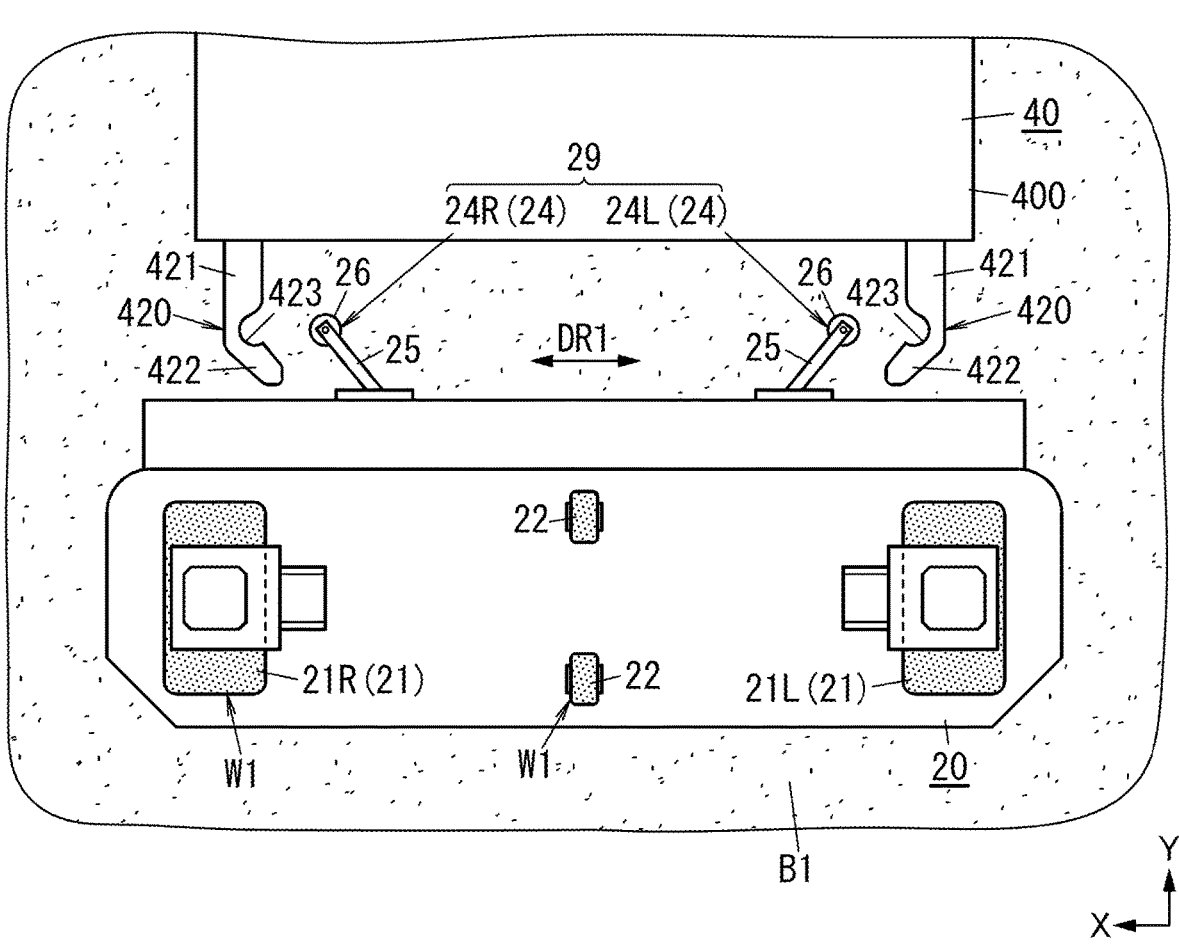
FIG. 4 is a plan view illustrating a state where a burden is yet to be coupled to the carrier.
Figure 5:
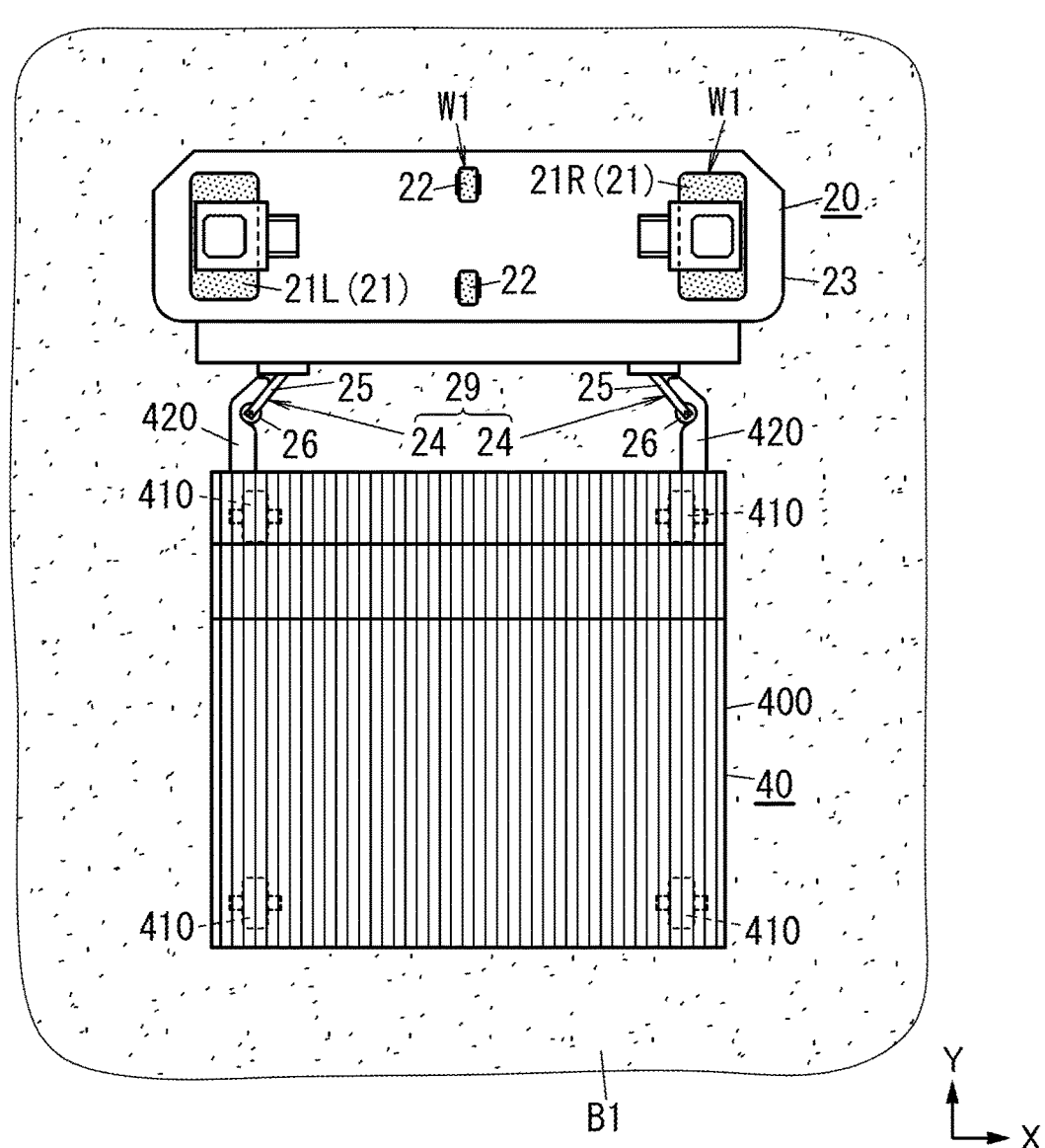
FIG. 5 is a plan view illustrating a state where the burden has been coupled to the carrier.

As shown in FIGS. 1 and 2, a manufacturing system 1 according to this embodiment includes one or more manufacturing apparatuses 11, a carrier 20, and a control system 30. The one or more manufacturing apparatuses 11 each perform predetermined work on a board. The carrier 20 carries a burden 40. The control system 30 controls carrying work by the carrier 20. The burden 40 includes a plurality of functional modules. Each of the plurality of functional modules provides a predetermined function for the one or more manufacturing apparatuses 11. The carrier 20 includes a coupling portion 29 to be coupled to any of the plurality of functional modules as shown in FIGS. 4 and 5. The control system 30 has at least one functional module, selected from the plurality of functional modules and coupled to the coupling portion 29, carried by the carrier 20.

As used herein, the "predetermined work" performed by the one or more manufacturing apparatuses 11 is the work to be performed on a board. In the following description of embodiments, the predetermined work is supposed to be the work to be performed on a board on a mounting line 10 for mounting parts onto the board. However, the predetermined work does not have to be the work to be performed on the board on the mounting line 10 but may also include work to be performed on the board in at least one process step selected from various process steps including the step of manufacturing the board itself, the step of mounting parts onto the board, and the step of inspecting the board. That is to say, the manufacturing system 1 does not have to be applied to the mounting line 10 of the board but may be applied to at least one of the various manufacturing process steps of the board. The predetermined work may include, for example, at least one selected from the group consisting of: printing work of printing solder onto the board; mounting work of mounting parts onto the board (printed wiring board) on which wiring has been formed; and bonding work of bonding the parts onto the board by melting the solder applied onto the board. In the mounting line 10 shown in FIG. 1, the one or more manufacturing apparatuses 11 include a printer 11A for performing the printing work, two mounters 11B, 11C for performing the mounting work independently of each other, and a reflow soldering oven 11D for performing the bonding work.

The plurality of functional modules each perform a predetermined function with respect to the one or more manufacturing apparatuses 11. As used herein, the "predetermined function" may include at least one of the function of supplying solder and/or a mask to the printer 11A for performing the solder printing work or the function of collecting wastes from the printer 11A. The predetermined function may also include the function of feeding parts to the mounters 11B, 11C. If a reel, around which a tape having a plurality of parts attached thereto is wound, is fed to the mounters 11B, 11C, then the predetermined function may include recovering the tape, from which the plurality of parts have been removed, from the mounters 11B, 11C. On the other hand, if a tray, on which a plurality of parts are placed, is fed to the mounters 11B, 11C, then the predetermined function may include recovering the tray, from which the plurality of parts have been removed, from the mounters 11B, 11C. Optionally, the predetermined function may include at least one of the function of loading the board to the manufacturing apparatus 11, the function of unloading the board from the manufacturing apparatus 11, the function of collecting, for example, cutting chips of the reel part, the function of removing parts to be maintained from the manufacturing apparatus 11, or the function of bringing the maintained parts back to the manufacturing apparatus 11.

As used herein, the plurality of functional modules refers to modules each providing a predetermined function for the manufacturing apparatus 11. Examples of the plurality of functional modules include a parts feeding module, a tray feeding module, a waste collecting module, a board loading module, a board unloading module, a maintenance module, and a feeder refill module. The parts feeding module is a module for feeding a plurality of parts to be mounted on a board to the manufacturing apparatus 11. The plurality of parts to be fed by the parts feeding module to the manufacturing apparatus 11 may be in a bulk state, attached to a tape wound around a reel, attached to a tape roll without a reel, or in any other state (e.g., in a state where a plurality of parts are housed in a case). The tray feeding module is a module for feeding a plurality of trays, on each of which a plurality of parts are placed, to the manufacturing apparatus 11. The waste collecting module is a module for collecting the waste discharged from the manufacturing apparatus 11. The board loading module is a module for loading a plurality of boards as work targets onto the manufacturing apparatus 11. The board unloading module is a module for unloading the boards, on which the work has been done, from the manufacturing apparatus 11. The maintenance module provides at least one of the function of providing materiel for use to manufacture boards for the manufacturing apparatus 11, the function of removing parts to be maintained from the manufacturing apparatus 11, or the function of bringing the maintained parts back to the manufacturing apparatus 11. The maintenance module may provide, as the materiel for use to manufacture boards, solder paste, masks, a solvent tank to hold a solvent for dissolving the solder paste, and paper for wiping away the solder paste adhered to the masks, for the manufacturing apparatus 11. Note that the paper is materiel for the manufacturing apparatus 11 to perform wet cleaning. The solder paste adhered to the mask may be removed by wiping the mask with the paper to which the solvent is applied. The feeder refill module is a module for refilling the manufacturing apparatus 11 with feeders. The feeder refill module may be configured to supply, for example, a cassette feeder or a unit holding a single or a plurality of feeders to the manufacturing apparatus 11. Furthermore, the feeder refill module may be a collective exchange cart module configured to be coupled to the manufacturing apparatus 11. The collective exchange cart module is a cart for feeding multiple types of parts to the manufacturing apparatus 11. Exchanging the collective exchange cart module to be connected to the manufacturing apparatus 11 enables collectively exchanging the multiple types of parts to be fed to the manufacturing apparatus 11.

The control system 30 instructs the carrier 20 to carry at least one functional module coupled to the coupling portion 29. In this case, any of the plurality of functional modules may be coupled to the coupling portion 29 of the carrier 20. Thus, a single carrier 20 may carry any of multiple types of functional modules. This enables reducing the number of carriers 20 to be used on the mounting line 10.

The drawings to be referred to in the following description of embodiments are all schematic representations. Thus, the ratio of the dimensions (including thicknesses) of respective constituent elements illustrated on the drawings does not always reflect their actual dimensional ratio.

(2) Details

Next, a manufacturing system 1 according to this embodiment will be described in detail with reference to the accompanying drawings.

As described above, the manufacturing system 1 according to this embodiment is used on the mounting line 10 for mounting parts onto a board. The manufacturing system 1 includes one or more manufacturing apparatuses 11, a carrier 20, and a control system 30.

Next, the one or more manufacturing apparatuses 11, the carrier 20, and the control system 30 that form the manufacturing system 1 will be described with reference to the accompanying drawings.

(2.1) Mounting Line

The mounting line 10, to which the manufacturing system 1 according to this embodiment is applied, will be described with reference to FIGS. 1 and 2.

A facility F1 provided with the mounting line 10 has a material area A1 and a mounting area A2 in which the mounting line 10 is installed.

In the material area A1, installed is a warehouse such as an automatic warehouse 70 for storing boards, parts, and various types of materials (such as solder and mask materials). The boards, parts, and various types of materials (such as solder and mask materials), delivered from the warehouse such as the automatic warehouse 70, are carried by either a worker or a carrier robot to the mounting area A2.

In the mounting area A2, provided is a preparatory area A3 where articles to be fed to the manufacturing apparatuses 11 are prepared. The preparatory area A3 includes a first preparatory area A31, a second preparatory area A32, and a third preparatory area A33.

In the first preparatory area A31, a plurality of reels, on each of which parts to be mounted on the board are attached, are carried from the material area A1. In the first preparatory area A31, the work of loading the plurality of reels into a parts feeding module 41 (refer to FIG. 6) is performed by either the worker or an automated machine, for example. The parts feeding module 41 loaded with the plurality of reels is moved by the carrier 20 to the destination where the mounters 11B, 11C are installed.

In the second preparatory area A32, a plurality of trays, on each of which parts to be mounted on the board are placed, are carried from the material area A1. In the second preparatory area A32, the work of loading the plurality of trays into a tray feeding module 42 (refer to FIG. 7) is performed by either the worker or an automated machine, for example. The tray feeding module 42 loaded with the plurality of trays is moved by the carrier 20 to the destination where the mounters 11B, 11C are installed.

In the third preparatory area A33, the materials to be used by the manufacturing apparatuses 11 (such as boards and solder or masks) are carried from the material area A1. In the third preparatory area A33, the work of loading the materials to be used by the manufacturing apparatuses 11 into the functional module is performed by either the worker or an automated machine, for example. The functional module loaded with the materials is moved by the carrier 20 to a place where the target manufacturing apparatus 11 is installed.

In addition, the mounting area A2 also has a collection area A4 for temporarily storing the waste collected from the manufacturing apparatuses 11. The waste discharged from the manufacturing apparatuses 11 is loaded into a waste collecting module 44 (refer to FIG. 1) connected to the manufacturing apparatuses 11. The carrier 20 carries the waste collecting module 44 connected to the manufacturing apparatuses 11 to the collection area A4 and accumulates, in the collection area A4, the waste loaded in the waste collecting module 44. Then, the waste accumulated in the collection area A4 is carried by either the worker or a carrier robot, for example, to a waste accumulation place provided for the facility F1.

Next, the mounting line 10 provided in the mounting area A2 will be described. The mounting line 10 is a manufacturing line for mounting parts onto the board. The mounting line 10 includes a plurality of (e.g., four) manufacturing apparatuses 11 which are arranged side by side in the direction in which the board is transported and a plurality of (e.g., two) inspection machines 12. In this embodiment, the four manufacturing apparatuses 11 are the printer 11A for printing solder onto the board, the two mounters 11B, 11C for performing mounting work of mounting parts onto the board on which solder has been printed, and the reflow soldering oven 11D for performing bonding work of bonding the parts onto the board. The two inspection machines 12 are a first inspection machine 12A for inspecting the position of the solder printed on the board and a second inspection machine 12B for inspecting the positions of the parts placed on the board.

In the mounting line 10, each board is transported from the left to the right in FIG. 1. On the mounting line 10, the printer 11A, the first inspection machine 12A, the mounters 11B, 11C, the second inspection machine 12B, and the reflow soldering oven 11D are arranged side by side in this order in the direction in which a plurality of boards are placed.

The mounters 11B, 11C each include a mounting nozzle for mounting, onto the board, the parts that have been fed thereto. The mounters 11B, 11C each mount, through the mounting nozzle onto predetermined locations on the board, either the parts that have been fed from the parts feeding module 41 for feeding one or more reels, around which a tape loaded with the parts is wound, or the parts that have been fed from the tray feeding module 42 for feeding a tray on which the parts are placed.

The reflow soldering oven 11D performs the work of bonding the parts that have been mounted on the board and the wiring together by melting the solder applied onto the board.

In the manufacturing system 1 according to this embodiment, the parts feeding module 41, the tray feeding module 42, and the waste collecting module 44 described above are the functional modules (burdens 40) to be carried by the carrier 20. That is to say, the one or more manufacturing apparatuses 11 include at least the mounters 11B, 11C for mounting parts onto the board and the plurality of functional modules includes at least one of the parts feeding module 41, the tray feeding module 42, or the waste collecting module 44. The parts feeding module 41 may feed, for example, a reel around which a tape loaded with the parts is wound to the mounters 11B, 11C. The tray feeding module 42 feeds a tray on which the parts are placed to the mounters 11B, 11C. The waste collecting module 44 collects the waste discharged from the manufacturing apparatuses 11.

Figure 6:
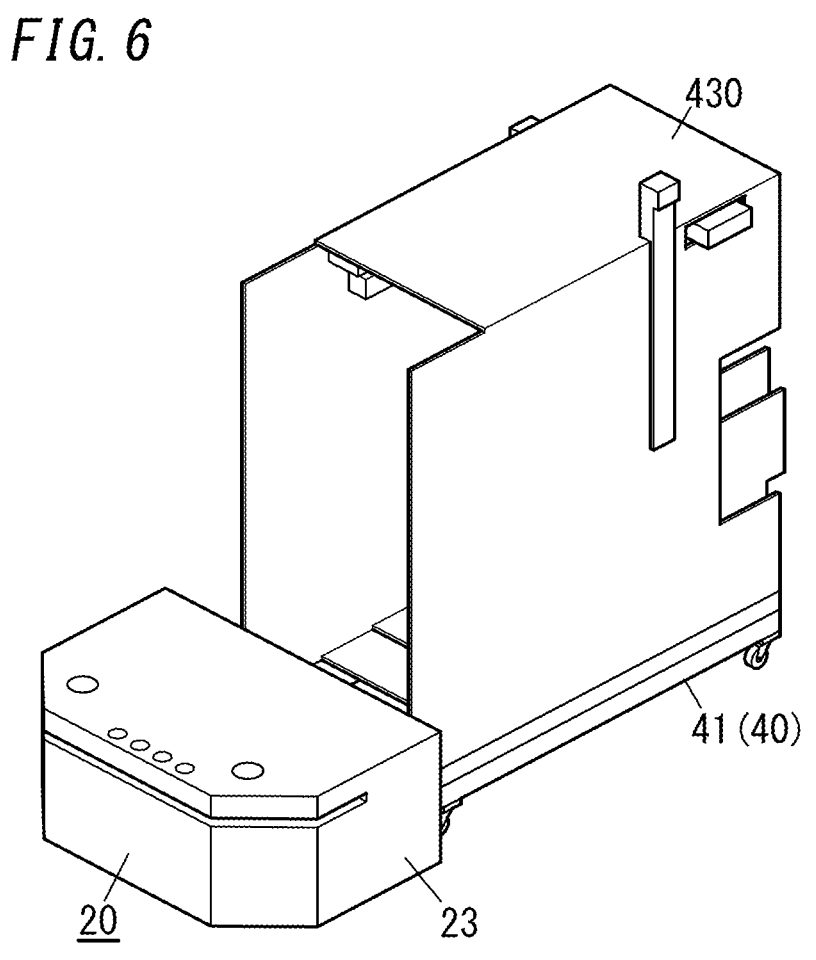
Figure 7:
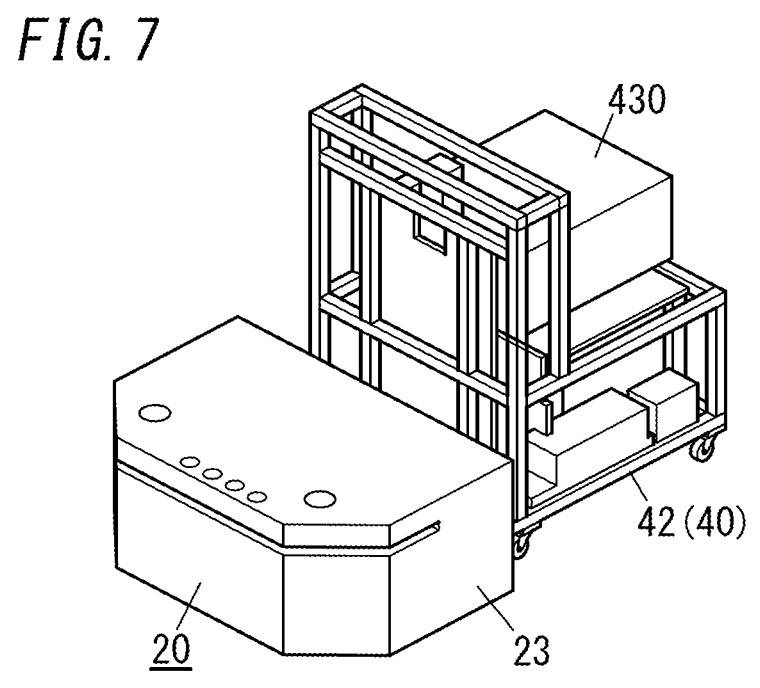
Figure 8:
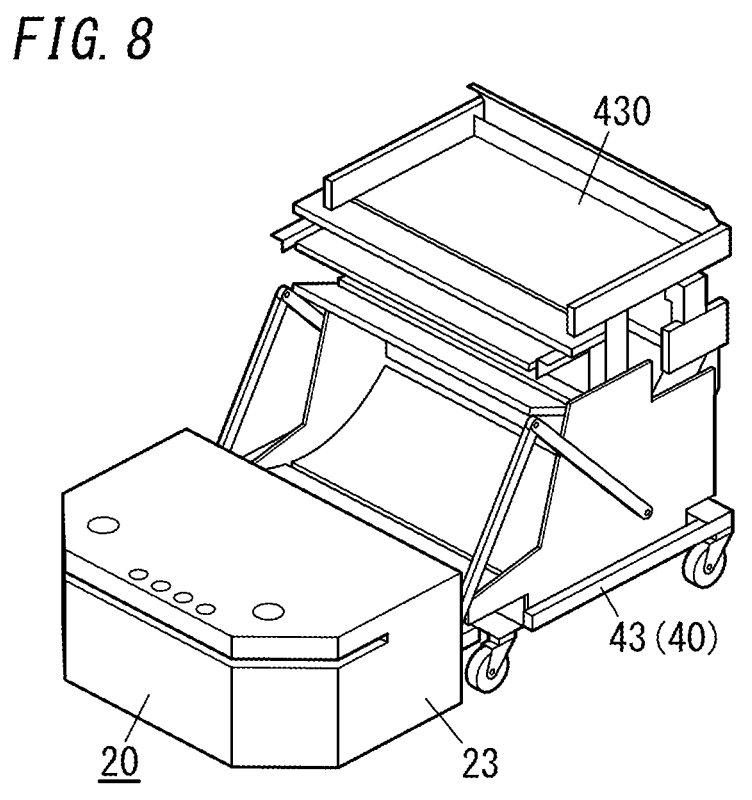

FIG. 6 illustrates an example of the parts feeding module 41. The parts feeding module 41 includes a functional unit 430 for feeding either a single reel or a plurality of reels to the mounters 11B, 11C. FIG. 7 illustrates the tray feeding module 42. The tray feeding module 42 includes a functional unit 430 for feeding either a single tray or a plurality of trays to the mounters 11B, 11C. Note that the parts feeding module 41 shown in FIG. 6 feeds reels to the mounters 11B, 11C by exchanging, one by one, the plurality of reels attached to the mounters 11B, 11C. However, this is only an example and should not be construed as limiting. Alternatively, the functional module may also be a collective exchange module 43 (refer to FIG. 8) for collectively exchanging the plurality of reels attached to the mounters 11B, 11C. The collective exchange module 43 includes a functional unit 430 which enables collectively exchanging the plurality of reels attached to the mounters 11B, 11C. The waste collecting module 44 includes an accumulator for accumulating the waste discharged from the manufacturing apparatuses 11 and provides the function of accumulating the waste for the manufacturing apparatuses 11. Furthermore, the functional module may also be, for example, a feeder refill module for feeding a cassette feeder to the manufacturing apparatuses 11 or a feeder refill module for feeding a unit holding either a single feeder or a plurality of feeders to the manufacturing apparatuses 11.

Optionally, the functional modules (burdens 40) may further include a board loading/unloading module 45 and a maintenance module 46.

The board loading/unloading module 45 is a functional module for providing the function of loading the board into the manufacturing apparatuses 11 and the function of unloading the board from the manufacturing apparatuses 11. The board loading/unloading module 45 not only loads the board into the manufacturing apparatuses 11 but also unloads the board from the manufacturing apparatuses 11. However, this is only an example and should not be construed as limiting. Alternatively, a functional module for loading the board into the manufacturing apparatuses 11 and a functional module for unloading the board from the manufacturing apparatuses 11 may be provided as two different functional modules.

The maintenance module 46 provides, for example, the function of removing parts to be maintained from the manufacturing apparatus 11 and the function of bringing the maintained parts back to the manufacturing apparatus 11. When the carrier 20 carries the maintenance module 46 to the manufacturing apparatus 11 that needs maintenance and couples the maintenance module 46 to the manufacturing apparatus 11, the maintenance module 46 removes the parts to be maintained from the manufacturing apparatus 11. Thereafter, when the carrier 20 moves the maintenance module 46 to a maintenance area in the facility F1, the maintenance work on the parts to be maintained is performed by either the worker or a robot, for example. When the maintenance work is done on the parts to be maintained, the carrier 20 carries the maintenance module 46 holding the parts to be maintained to the manufacturing apparatus 11 and couples the maintenance module 46 to the manufacturing apparatus 11. When the maintenance module 46 brings the maintained parts back to the manufacturing apparatus 11, the carrier 20 disconnects the maintenance module 46 from the manufacturing apparatus 11 and moves the maintenance module 46 to, for example, the maintenance area to make the maintenance module 46 stand by in the maintenance area. Optionally, the maintenance module 46 may also provide the function of providing the materiel for use to manufacture boards (such as solder paste, masks, a solvent tank, and paper) for the manufacturing apparatus 11.

(2.2) Carrier

Next, one or more carriers 20 for use in the manufacturing system 1 according to this embodiment will be described with reference to FIGS. 1-5.

The carrier 20 is an unmanned carrier vehicle that travels to carry the burden 40 as shown in FIG. 1.

Figure 3:
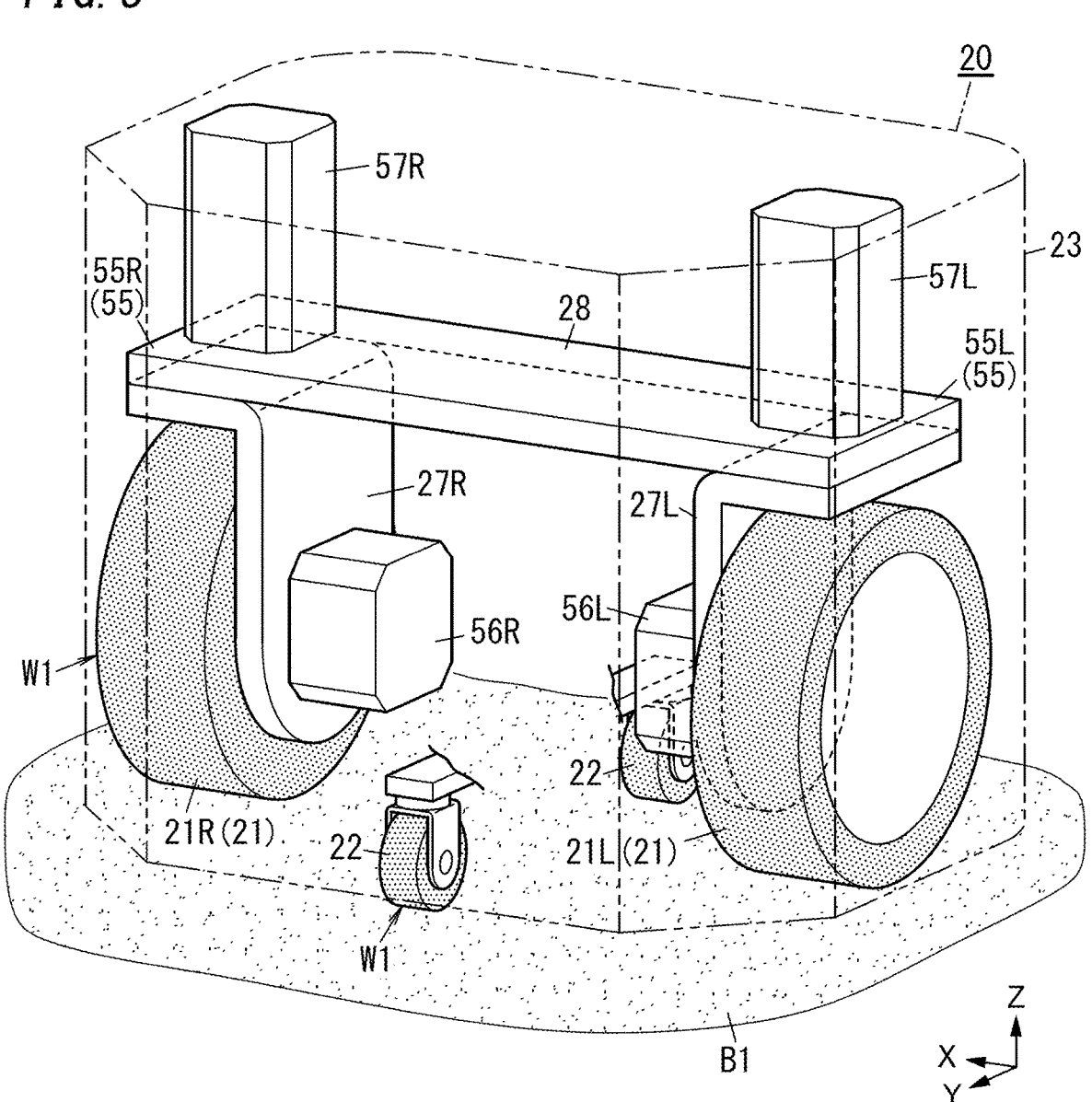
FIG. 3 is a schematic perspective view of a carrier for use in the manufacturing system.

On the lower surface of a body 23 of the carrier 20, arranged are wheels WI including a pair of drive wheels 21 and a pair of auxiliary wheels 22 as shown in FIGS. 3-5. The pair of drive wheels 21 are arranged side by side in the rightward/leftward direction with respect to the body 23. The pair of auxiliary wheels 22 are arranged in the forward/backward direction along a centerline of the body 23 in the rightward/leftward direction. As used herein, the "rightward/leftward direction" corresponds to the longitudinal axis of the carrier 20 and the X-axis direction shown in FIGS. 3-5. On the other hand, the "forward/backward direction" defined with respect to the carrier 20 is a direction perpendicular to both the rightward/leftward direction and an upward/downward direction (which is defined by a normal to the traveling surface B1 on which the carrier 20 travels), i.e., corresponds to the latitudinal axis of the carrier 20 and the Y-axis direction shown in FIGS. 3-5. In the following description, out of the pair of drive wheels 21, the drive wheel 21 located on the left side of the body 23 will be hereinafter referred to as a "left drive wheel 21L" and the drive wheel 21 located on the right side of the body 23 will be hereinafter referred to as a "right drive wheel 21R." Note that the shape of the body 23 may be changed as appropriate according to the type of the functional module to carry, for example.

One surface of the carrier 20 in the forward/backward direction has a coupling portion 29 for coupling the burden 40 thereto. The coupling portion 29 is configured as grasping portions 24 with the ability to grasp graspable portions 420 provided for the burden 40. Making the grasping portions 24 grasp the graspable portions 420 of the burden 40 allows the coupling portion 29 to couple the burden 40 to the carrier 20 (in a coupling step). Thus, the carrier 20 moves along with the burden 40 which has been coupled to the carrier 20 by the coupling portion 29 (in a carrying step).

In the following description, when the carrier 20 moves in the forward/backward direction, the direction in which the carrier 20 is going to travel (i.e., the traveling direction) will be hereinafter referred to as a "forward direction" and the opposite direction thereof will be hereinafter referred to as a "backward direction." The carrier 20 may carry the burden 40 either by towing the burden 40 with the carrier 20 traveling ahead of the burden 40 or by pushing the burden 40 with the burden 40 traveling ahead of the carrier 20. Generally speaking, the carrier 20 may travel with more stability when towing the burden 40 rather than when pushing the burden 40 from behind the burden 40. Thus, the carrier 20 normally moves while towing the burden 40. When the carrier 20 moves while towing the burden 40, the positive Y-axis direction is the forward direction, and the positive X-axis direction is the rightward direction. In the following description, the positive Y-axis direction is supposed to be the forward direction and the positive X-axis direction is supposed to be the rightward direction. However, these directions are only examples and the carrier 20 may travel in any other arbitrary direction. For example, the carrier 20 may also travel in the rightward/leftward direction. When the carrier 20 travels in the rightward/leftward direction, the burden 40 and the carrier 20 move such that the burden 40 and the carrier 20 are arranged in a direction intersecting with their traveling direction.

The lower surface of a body 400 of the burden 40 is provided with a plurality of wheels 410. The burden 40 is configured to travel on the traveling surface B1 on the wheels 410. On one surface of the body 400 (e.g., a front surface in a situation where the burden 40 is towed by the carrier 20), two graspable portions 420 are provided to be arranged side by side in an arrangement direction DR1 (refer to FIG. 4). Each of the two graspable portions 420 includes a base portion 421 protruding forward from the body 400 and a hook portion 422 protruding obliquely forward from the tip of the base portion 421. In this case, the interval between the two hook portions 422 of the two graspable portions 420 narrows toward the front end thereof. Also, each graspable portion 420 has a recess 423, into which a roller 26 of its corresponding grasping portion 24 is to be fitted and which is provided to cover both the base portion 421 and the hook portion 422.

As shown in FIG. 2, the carrier 20 further includes a control unit 51, a power supply 52, a communications unit 53, a detection unit 54, drive wheel units 55 for driving the plurality of drive wheels 21, and driving units 58 for driving the grasping portions 24.

In this embodiment, each of the left drive wheel 21L and the right drive wheel 21R serves as a steered wheel as well. A driving mechanism for driving the left drive wheel 21L and a steering mechanism for changing the orientation of the left drive wheel 21L are integrated together as a left drive wheel unit 55L (refer to FIGS. 2 and 3). In addition, a driving mechanism for driving the right drive wheel 21R and a steering mechanism for changing the orientation of the right drive wheel 21R are integrated together as a right drive wheel unit 55R (refer to FIGS. 2 and 3). That is to say, the drive wheel units 55 include the left drive wheel unit 55L and the right drive wheel unit 55R.

The left drive wheel unit 55L controls the rotation and steering angle of the left drive wheel 21L. As shown in FIGS. 2 and 3, the left drive wheel unit 55L includes: a drive motor 56L for turning the left drive wheel 21L in a circumferential direction; and a steering motor 57L for changing the orientation (rolling direction) of the left drive wheel 21L. The steering motor 57L is attached to a left end portion of a flat fixing plate 28, which is provided along the lower surface of the body 23 with respect to the body 23. The steering motor 57L changes the orientation of the left drive wheel 21L by rotating a bracket 27L, to which the drive motor 56L is fixed, within a plane parallel to the traveling surface B1. In this case, in accordance with a control command from the control unit 51, the left drive wheel unit 55L makes the steering motor 57L change the orientation of the left drive wheel 21L into an orientation instructed by the control command and also makes the drive motor 56L turn the left drive wheel 21L with rotational torque or rotational velocity instructed by the control command.

The right drive wheel unit 55R controls the rotation and steering angle of the right drive wheel 21R. As shown in FIGS. 2 and 3, the right drive wheel unit 55R includes: a drive motor 56R for turning the right drive wheel 21R in a circumferential direction; and a steering motor 57R for changing the orientation (rolling direction) of the right drive wheel 21R. The steering motor 57R is attached to a right end portion of the fixing plate 28. The steering motor 57R changes the orientation of the right drive wheel 21R by rotating a bracket 27R, to which the drive motor 56R is fixed, within a plane parallel to the traveling surface B1. In this case, in accordance with a control command from the control unit 51, the right drive wheel unit 55R makes the steering motor 57R change the orientation of the right drive wheel 21R into an orientation instructed by the control command and also makes the drive motor 56R turn the right drive wheel 21R with rotational torque or rotational velocity instructed by the control command.

Also, in this embodiment, the control unit 51 controls the right drive wheel unit 55R to drive the right drive wheel 21R independently of the left drive wheel 21L and also controls the left drive wheel unit 55L to drive the left drive wheel 21L independently of the right drive wheel 21R. That is to say, the pair of drive wheels 21 (namely, the right drive wheel 21R and the left drive wheel 21L) may be driven independently of each other. Thus, turning the pair of drive wheels 21 with the rotational torque or rotational velocity instructed by the control command and steering the pair of drive wheels 21 to the direction instructed by the control command allows the carrier 20 to travel in any desired direction. In this embodiment, each of the pair of drive wheels 21 also serves as a steered wheel. This may reduce the number of wheels provided for the carrier 20, compared to a situation where steered wheels are provided separately from the drive wheels 21.

The two auxiliary wheels 22 provided for the body 23 are driven wheels, of which the orientations change according to the traveling direction of the carrier 20. The two auxiliary wheels 22 include casters, of which the axle has a variable orientation. That is to say, each of the two auxiliary wheels 22 may be, for example, a caster (i.e., a so-called "free-rolling caster"), of which the axle that supports the wheel rotatably is movable in 360-degree directions within a plane parallel to the traveling surface B1. Note that the casters for use as the auxiliary wheels 22 do not have to be such casters, of which the axle has a variable orientation, but may also be ball casters, each of which has a sphere serving as a wheel and rotatable in any direction.

In this embodiment, the carrier 20 includes the two drive wheels 21. However, this is only an example and should not be construed as limiting. Alternatively, the number of the drive wheels 21 may also be one or three or more, whichever is appropriate. Also, in this embodiment, the carrier 20 includes the two auxiliary wheels 22. However, the number of the auxiliary wheels 22 does not have to be two but may also be one or three or more, whichever is appropriate. That is to say, as long as the carrier 20 is in contact with the traveling surface B1 on three or more wheels including the drive wheel 21 and the auxiliary wheel 22, the number of the drive wheels 21 and the number of the auxiliary wheels 22 may be changed as appropriate.

Next, the grasping portions 24 for grasping the graspable portions 420 of the burden 40 and the driving units 58 for driving the grasping portions 24 will be described. The rear surface of the body 23 is provided with the two grasping portions 24 for respectively grasping the two graspable portions 420 of the burden 40 such that the grasping portions 24 are drivable with respect to the body 23. The driving units 58 respectively drive the two grasping portions 24 in the arrangement direction DR1. The driving units 58 have two sets, each including: a feed screw; a servo motor for turning the feed screw; and a slider which is held by the feed screw, and which moves along the axis of the feed screw as the feed screw turns. The grasping portions 24 are attached to the respective sliders of these two sets. In accordance with a control command from the control unit 51, the driving unit 58 drives the two grasping portions 24 in mutually opposite directions in the arrangement direction DR1. The feed screw may be, for example, a slide screw (trapezoidal screw) but may also be a ball screw, for example.

As shown in FIGS. 4 and 5, each of the grasping portions 24 includes a pair of arms 25 protruding obliquely backward from the slider and the roller 26 held between the respective tip portions of the pair of arms 25.

In this case, having the two grasping portions 24 driven away from each other (i.e., outward) by the driving units 58 with the two grasping portions 24 located between the two graspable portions 420 will make the roller 26 of each grasping portion 24 fitted into the recess 423 of an associated one of the graspable portions 420. This makes the graspable portions 420 grasped by the grasping portions 24 and also makes the carrier 20 and the burden 40 coupled to each other by the coupling portion 29.

On the other hand, having the two grasping portions 24 driven toward each other (i.e., inward) by the driving units 58 with the graspable portions 420 grasped by the grasping portions 24 brings the roller 26 of each grasping portion 24 away from the recess 423 of the associated one of the graspable portions 420. This makes the graspable portions

420 no longer grasped by the grasping portions 24 and also makes the burden 40 decoupled from the carrier 20.

As can be seen, driving the two grasping portions 24 away from each other in the arrangement direction DR1 brings the grasping portions 24 into contact with the graspable portions 420 to make the carrier 20 grasp the burden 40. This allows the carrier 20 to grasp any burden 40 as long as the burden 40 has the graspable portions 420. The grasping portions 24 are brought into contact with the graspable portions 420 by being driven in the arrangement direction DR1. Thus, even if multiple types of burdens 40 have mutually different intervals between the pair of graspable portions 420, the carrier 20 may still grasp and carry any of the multiple types of burdens 40. That is to say, the coupling portion of the carrier 20 may be coupled to two or more functional modules out of the plurality of functional modules. This allows a single carrier 20 to carry any one of the two or more functional modules. This achieves the advantage of enabling reducing the number of carriers 20 that need to be used to carry a plurality of functional modules.

Next, the detection unit 54 will be described. The detection unit 54 detects the behavior of the body 23 and the surroundings of the body 23, for example. As used herein, the "behavior" refers to the operation and appearance, for example. Specifically, the behavior of the body 23 includes the operating state of the body 23 which may be traveling or at a stop, the distance that the body 23 has traveled and its duration, the velocity (and variation in the velocity) of the body 23, acceleration applied to the body 23, and the orientation of the body 23.

The detection unit 54 includes, for example, sensors such as a light detection and ranging (LiDAR) sensor 541 for detecting an object present around the body 23, a reflective sensor 542, and a magnetic sensor 543.

The LiDAR sensor 541 detects the presence or absence of any object around the body 23, also detects its location if there is any object around the body 23, and outputs the result of detection to the control unit 51. The reflective sensor 542 transmits a probe signal such as a laser beam, detects the presence of an object based on a result of reception of a reflected signal generated by having the probe signal reflected from the object, and outputs the result of detection to the control unit 51. The control unit 51 may estimate the current location of the carrier 20 and make the carrier 20 stop exactly at the designated spot in accordance with the information collected by the LiDAR sensor 541 or the reflective sensor 542 about the surrounding objects and map data about the area where the carrier 20 is traveling. In addition, the control unit 51 may also prevent, based on the information collected by the LiDAR sensor 541 or the reflective sensor 542 about the object, the carrier 20 from colliding against the object.

The guidance line provided on the traveling surface B1 may be made of, for example, rubber including a hard magnetic material such as a permanent magnet material and is formed in the shape of a line to extend on the surface of the traveling surface B1 along the traveling route of the carrier 20.

The magnetic sensor 543 detects, by magnetism, the guidance line provided on the traveling surface B1 on which the carrier 20 travels. The control unit 51 controls, based on the result of detection obtained by the magnetic sensor 543, the right drive wheel unit 55R and the left drive wheel unit 55L such that the carrier 20 travels along the guidance line. That is to say, the carrier 20 travels on the traveling surface B1 based on the result of detection obtained by the magnetic sensor 543.

Optionally, the detection unit 54 may detect, based on the location information, collected by the LiDAR sensor 541, about a surrounding object and by reference to electronic map information about a predetermined area including the material area A1 and the mounting area A2, the current location of the carrier 20 within the predetermined area and output the result of detection of the current location to the control unit 51.

Also, the detection unit 54 may include a receiver for receiving beacon signals transmitted as radio waves from a plurality of transmitters installed in a predetermined area, detect the current location of the carrier 20 based on the beacon signals transmitted from the plurality of transmitters, and output the result of detection of the current location to the control unit 51. The detection unit 54 estimates, based on the locations of the plurality of transmitters and the received radio wave strengths of the beacon signals received at the receiver, the current location of the carrier 20. Alternatively, the detection unit 54 may also detect the current location of the carrier 20 by using a positioning system such as the global positioning system (GPS).

The control unit 51 includes a microcomputer including, for example, one or more processors and a memory. In other words, the control unit 51 is implemented as a computer system including one or more processors and a memory. The control unit 51 outputs, in accordance with a carry instruction from the control system 30 (second controller 32) and based on a result of detection obtained by the detection unit 54, for example, a control command to each drive wheel unit 55, thereby allowing the carrier 20 to move in any desired direction at a desired velocity. In addition, the control unit 51 controls the two driving units 58 to drive the corresponding grasping portions 24 in the arrangement direction DR1. This allows the control unit 51 to drive the two grasping portions 24 between locations where the two grasping portions 24 are in contact with their corresponding graspable portions 420 and locations where the two grasping portions 24 are out of contact with their corresponding graspable portions 420.

The power supply 52 may be a secondary battery, for example. The power supply 52 supplies power either directly or indirectly to the left drive wheel unit 55L and the right drive wheel unit 55R, the control unit 51, the communications unit 53, the detection unit 54, the driving units 58, and other components. Optionally, the carrier 20 may be supplied with power from an external power supply. In that case, the carrier 20 does not have to include the power supply 52.

The communications unit 53 is configured to be ready to communicate with the second controller 32. In this embodiment, the communications unit 53 communicates, by wireless communication using radio waves as a propagation medium, with any of a plurality of relays 34 installed within the predetermined area including the material area A1 and the mounting area A2. Each relay 34 is a device (access point) that relays communication between the communications unit 53 and the second controller 32. The relay 34 communicates with the second controller 32 via a network in the facility F1. Thus, the communications unit 53 and the second controller 32 communicate with each other indirectly via at least the relays 34 and the network in the facility F1. In this embodiment, wireless communication compliant with a standard such the Wi-Fi®, Bluetooth®, ZigBee®, or a low power radio standard requiring no licenses (such as the Specified Low Power Radio standard) may be adopted, for example, as the communication between the relay 34 and the communications unit 53.

(2.3) Control System

The control system 30 includes a first controller 31, the second controller 32, and an integrated controller 33 as shown in FIGS. 1 and 2. The first controller 31, the second controller 32, and the integrated controller 33 are configured to be ready to communicate with each other. As used herein, "to be ready to communicate" means being able to transmit and receive information either directly or indirectly via a network NT1 or a relay, for example, by an appropriate communications method that is either wired communication or wireless communication.

The first controller 31 monitors the respective operations of the plurality of manufacturing apparatuses 11 and plurality of inspection machines 12 included in the mounting line 10. The first controller 31 is configured to be ready to communicate with the plurality of manufacturing apparatuses 11 and the plurality of inspection machines 12 via a network. The first controller 31 collects state information indicating the operating state from the plurality of manufacturing apparatuses 11 and the plurality of inspection machines 12 (i.e., state information indicating the operating state of the mounting line 10) and outputs the state information thus collected to the integrated controller 33.

The second controller 32 is configured to be ready to communicate with a plurality of carriers 20 for use in the facility F1 via one or more relays 34 installed in the facility F1. The second controller 32 gives a carry instruction to each of the plurality of carriers 20 and controls the carrying work being performed by each carrier 20.

The integrated controller 33 controls the respective operations of the plurality of carriers 20 by giving a control instruction to the second controller 32 based on the state information that the integrated controller 33 has received from the first controller 31. The integrated controller 33 (control system 30) includes a selection unit 331 and a carrying instruction unit 332. The selection unit 331 selects, from a plurality of functional modules, at least one functional module as the burden 40. Each of the plurality of functional modules provides a predetermined function for one or more manufacturing apparatuses 11. Each of the one or more manufacturing apparatuses 11 performs predetermined work on the board. The carrying instruction unit 332 outputs a carry instruction, instructing that the burden 40 be carried, to the carrier 20. That is to say, the integrated controller 33 outputs, depending on the type of the predetermined work to be performed by the mounting line 10, a carry instruction, instructing that parts or a material required for the work to be performed on the mounting line 10 be carried, to the carrier 20. In addition, the integrated controller 33 also outputs, depending on the type of the predetermined work performed by the mounting line 10, a carry instruction, instructing that the waste collecting module 44 for collecting the waste discharged from the manufacturing apparatuses 11 of the mounting line 10 be carried, to the carrier 20.

The control system 30 generates, in real time, an optimum supply plan of supplying the plurality of functional modules to the plurality of manufacturing apparatuses 11 and selects, according to this supply plan, a functional module to be carried to the manufacturing apparatuses 11 from the plurality of functional modules. The control system 30 makes the carrier 20 carry the selected functional module to a place where the functional module may provide the predetermine function for the manufacturing apparatuses 11. Alternatively, the control system 30 may also make, according to a supply plan generated in real time by a high-order system, the carrier 20 supply the plurality of functional modules to the plurality of manufacturing apparatuses 11. The control system 30 supplies the plurality of functional modules to the plurality of manufacturing apparatuses 11 according to an efficient supply plan. This may reduce the chances of the manufacturing apparatuses 11 being brought to a halt by delayed feeding or collection of parts, for example, cut down the loss due to such a halt of the manufacturing apparatuses 11, and reduce the numbers of the manufacturing apparatuses 11, the functional modules, and the carriers 20 to be used to required minimum ones, thus enabling cutting down the cost to introduce and maintain the manufacturing system 1.

Optionally, the integrated controller 33 may control the respective operations of the plurality of manufacturing apparatuses 11 and the plurality of inspection machines 12 included in the mounting line 10. The integrated controller 33 may output, according to the type of the predetermined work to be performed by the mounting line 10, a carry instruction, instructing that the parts or material to be used for the work being performed on the mounting line 10 be caried, to the carrier 20 while controlling the respective operations of the plurality of manufacturing apparatuses 11 and the plurality of inspection machines 12.

Also, the control system 30 may be provided outside of the facility F1. In that case, the control system 30 may communicate with the manufacturing apparatuses 11 and inspection machines 12 on the mounting line 10 and the carriers 20 via the Internet and a network inside the facility F1.

(2.4) Description of Operation

Figure 9:
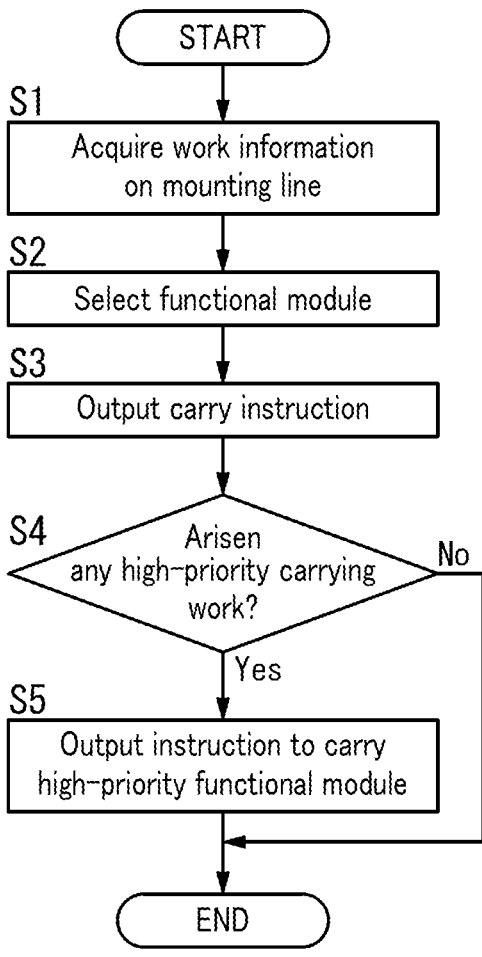
FIG. 9 is a flowchart showing an exemplary operation of the manufacturing system.

Next, it will be described with reference to FIG. 9 and other drawings how the manufacturing system 1 according to this embodiment operates. Note that the flowchart shown in FIG. 9 shows just an exemplary control method to be performed by the control system 30 according to this embodiment. Thus, the processing steps shown in FIG. 9 may be performed in a different order as appropriate, an additional processing step may be performed as needed, or at least one of the processing steps may be omitted as appropriate.

The plurality of manufacturing apparatuses 11 and inspection machines 12 that form the mounting line 10 perform, in accordance with a control command given by a high-order system, for example, predetermined work related to mounting on the board (including printing solder, mounting parts, solder reflowing, and inspection of the board).

In this case, the plurality of manufacturing apparatuses 11 that form the mounting line 10 output work information (state information) to the first controller 31 at an appropriate timing. The work information includes information about the predetermined work to be performed on the board. As used herein, the "appropriate timing" may be a timing when the manufacturing apparatuses 11 need to be provided with a predetermined function (such as feeding of parts or a material) by a functional module in order to perform the predetermined work. Optionally, the appropriate timing may include a timing when the manufacturing apparatuses 11 receive a request to transmit the work information (state information) from either the first controller 31 or the integrated controller 33.

In this embodiment, the control system 30 makes the carrier 20 carry a functional module selected from the plurality of functional modules. Specifically, on acquiring, via the first controller 31, the work information (state information) from the manufacturing apparatuses 11 that form the mounting line 10 (in S1), the selection unit 331 of the integrated controller 33 selects a functional module to be carried by the carrier 20 in accordance with the information (work information) about the work to be performed by the manufacturing system 1 (in S2). Optionally, the selection unit 331 may select, by using a learned model, the functional module to be carried by the carrier 20. This learned model has been generated by making a learning unit learn, using a pair of information, namely, the work information about the work to be performed by the manufacturing apparatuses 11 (specifically, information about the specifics or object of the work) and information about the functional module (burden 40) to be carried to the manufacturing apparatuses 11 as supervised data, the relationship between these two types of information. This learned model may be generated by making the learning unit provided for the integrated controller 33 perform machine learning. Alternatively, a learned model generated by making another computer perform machine learning may be loaded into the integrated controller 33.

On determining which functional module is to be carried, the carrying instruction unit 332 of the integrated controller 33 transmits a carry instruction, instructing that the functional module be carried to the manufacturing apparatuses 11, to the carrier 20 via the second controller 32 (in S3). When the communications unit 53 of the carrier 20 receives the carry instruction from the second controller 32, the control unit 51 controls the drive wheel units 55 to make the carrier 20 move to the preparatory area A3 where the functional module to carry is stationed. The control unit 51 of the carrier 20 makes the grasping portions 24 grasp the functional module to carry (in the coupling step) and then has this functional module carried to the destination, i.e., the place where the target manufacturing apparatus 11 is located (in the carrying step). In this case, in a state where the carrier 20 is carrying the functional module, the functional module may be supplied with energy from the carrier 20. For example, the carrier 20 may include a power feeding connector which may be connected to a power receiving connector of the functional module. Then, energy may be supplied from the carrier 20 to the functional module by electrically connecting the power receiving connector of the functional module and the power feeding connector of the carrier 20 to each other while the carrier 20 is carrying the functional module. Supplying the functional module with energy in this manner from the carrier 20 allows the functional module to perform some type of work even while the functional module is being carried. In this case, the functional module may perform predetermined preparatory work while being carried by the carrier 20. For example, if the functional module is the parts feeding module 41, then the parts feeding module 41 may perform the preparatory work such as rearranging a plurality of reels loaded in the parts feeding module 41 adaptively to the mounter 11B as the destination, thus enabling making effective use of the interval in which the functional module is being carried. Also, the functional module may be supplied with energy by a contactless method from the carrier 20. Furthermore, although the functional module is supplied with electrical energy from the carrier 20 in this embodiment, the functional module may also be supplied with a different type of energy (such as a fuel) from electrical energy.

When the control unit 51 of the carrier 20 connects the functional module to carry to the manufacturing apparatus 11 at the destination, the functional module provides a predetermined function for the manufacturing apparatus 11. For example, if the functional module to carry is the parts feeding module 41 and the manufacturing apparatus 11 is the mounter 11B, then the parts feeding module 41 feeds the reels loaded with parts to the mounter 11B, thus allowing the mounter 11B to perform the work of mounting the parts, removed from the tapes on the reels, onto the board. Optionally, in a state where the functional module being currently carried is providing the function for the manufacturing apparatus 11, the carrier 20 may be supplied with energy from the manufacturing apparatus 11. For example, the carrier 20 may include a power receiving connector which may be connected to a power feeding connector of the manufacturing apparatus 11. Then, energy may be directly supplied from the manufacturing apparatus 11 to the carrier 20 to charge the battery of the power supply 52 by electrically connecting the power receiving connector of the carrier 20 to the power feeding connector of the manufacturing apparatus 11 with the functional module coupled to the manufacturing apparatus 11. This allows the carrier 20 to charge the battery by making effective use of the interval in which the functional module is coupled to the manufacturing apparatus 11. Alternatively, the carrier 20 may include a power receiving connector which may be connected to the power feeding connector of the functional module and may be supplied with energy from the manufacturing apparatus 11 via the functional module with the functional module coupled to the manufacturing apparatus 11. Furthermore, the carrier 20 may be supplied with energy by a contactless method either directly from the manufacturing apparatus 11 or indirectly from the manufacturing apparatus 11 via the functional module. Furthermore, although the carrier 20 is supplied with electrical energy from the manufacturing apparatus 11 in this embodiment, the carrier 20 may also be supplied with a different type of energy (such as a fuel) from electrical energy.

In this case, the integrated controller 33 determines whether or not there arises any need to perform the work of carrying a functional module having a higher priority (hereinafter referred to as a "priority module") than the functional module being currently carried, out of the plurality of functional modules, while the functional module that has been carried by the carrier 20 is currently located at a place where the functional module may provide a predetermined function for the manufacturing apparatus 11 (in S4). As used herein, the "functional module having the higher priority" refers to a functional module to be carried preferentially with respect to another functional module. If there arises any need to perform the work of carrying a priority module while the carrier 20 is performing the work of carrying a functional module with a low priority, the integrated controller 33 instructs the carrier 20 to suspend the work of carrying the functional module with the low priority and instead perform the work of carrying the priority module earlier than such a module with low priority.

If a decision is made in S4 that there be no need to perform the work of carrying the priority module (if the answer is NO in S4), then the carrier 20 continues the work of carrying the functional module being currently carried. Then, when the functional module finishes providing the function for the manufacturing apparatus 11, the integrated controller 33 transmits a carry instruction, instructing that the functional module be returned to the preparatory area A3, to the carrier 20 via the second controller 32. On receiving the carry instruction from the second controller 32, the carrier 20 disconnects the functional module from the manufacturing apparatus 11, makes the functional module move to the preparatory area A3, and decouples the functional module in the preparatory area A3. When the functional module goes back to the preparatory area A3, the work of refilling the functional module with parts or a material is performed by either the worker or an automated machine.

Note that after having decoupled the functional module, the carrier 20 moves to a predetermined standby place to prepare for the next carry instruction to come.

On the other hand, if a decision is made in S4 that there be any need to perform the work of carrying the priority module (if the answer is YES in S4), then the integrated controller 33 transmits a carry instruction, instructing the carrier 20 to suspend the current carrying work and carry the priority module instead, to the carrier 20 via the second controller 32 (in S5). In this case, the supply plan created by either the control system 30 or a high-order system includes priorities that are set with respect to, for example, the functions to be provided by the plurality of functional modules for the manufacturing apparatuses 11. The more urgent a function is, the higher its priority is. On deciding, based on the priority setting included in the supply plan, for example, that there be the need to perform the work of carrying a priority module having a higher priority, the integrated controller 33 transmits a carry instruction, instructing the carrier 20 to suspend the current carrying work and instead carry the priority module, to the carrier 20 via the second controller 32. When the communications unit 53 of the carrier 20 receives the carry instruction from the second controller 32, the control unit 51 controls the grasping portions 24 to decouple the functional module being carried. Then, the control unit 51 of the carrier 20 controls the drive wheel units 55 to move the carrier 20 to the preparatory area A3 where the priority module is stationed. The control unit 51 of the carrier 20 makes the grasping portions 24 grasp the priority module and then has this priority module moved to the destination, i.e., the place where the target manufacturing apparatus 11 is located. When the control unit 51 of the carrier 20 connects the priority module to carry to the manufacturing apparatus 11 at the destination, the functional module provides a predetermined function for the manufacturing apparatus 11. As can be seen, the carrier 20 performs the work of carrying the priority module preferentially over the work of carrying a functional module with a lower priority, thus enabling carrying the priority module to be connected to the manufacturing apparatus 11 urgently earlier than the functional module with the lower priority. Note that the suspended carrying work may be resumed either afterwards by the carrier 20 when the carrier 20 finishes carrying the priority module or performed concurrently by another carrier 20.

As can be seen, when there arises any need to perform the work of carrying the priority module while the carrier 20 is carrying another functional module, the integrated controller 33 (control system 30) instructs the carrier 20 to carry the priority module preferentially over the functional module being currently carried. This allows the work of carrying the priority module to be done preferentially by putting off the work of carrying the functional module having a lower priority than the priority module.

Optionally, in a predetermined state where the carrier 20 has carried a first functional module, selected from the plurality of functional modules, to the manufacturing apparatus 11 and the first functional module is currently located at a place where the first functional module may provide a predetermined function for the manufacturing apparatus 11, the control system 30 may make the carrier 20 perform a different type of work. Specifically, the control system 30 may make the carrier 20 decouple the first functional module and instead carry a second functional module selected from the plurality of functional modules except the first functional module. In the state where the first functional module connected to the manufacturing apparatus 11 is providing the predetermined function for the manufacturing apparatus 11, the carrier 20 that has carried the first functional module is no longer needed. Thus, making the control system 30 instruct the carrier 20 to perform the work of carrying the second functional module in such a situation achieves the advantage of increasing the operating rate of the carrier 20.

In addition, the manufacturing system 1 according to this embodiment includes a plurality of carriers 20, one of which will be hereinafter referred to as a "first carrier" and another one of which will be hereinafter referred to as a "second carrier." In this case, the control system 30 may have the functional module being carried by the first carrier decoupled from the first carrier and make the second carrier carry the functional module decoupled from the first carrier. For example, if the movable range of the first carrier is different from the movable range of the second carrier except an overlapping area, then the functional module may be carried to even an area that cannot be covered by the first carrier alone by passing the functional module that has been carried by the first carrier to the second carrier and making the second carrier inherit the work of carrying the functional module.

(3) Variations

Note that the embodiment described above is only an exemplary one of various embodiments of the present disclosure and should not be construed as limiting. Rather, the exemplary embodiment may be readily modified in various manners depending on a design choice or any other factor without departing from the scope of the present disclosure. The functions of the manufacturing system 1 may also be implemented as a manufacturing method, a computer program, or a non-transitory storage medium that stores the program thereon. The functions of the control system 30 may also be implemented as a control method, a computer program, or a non-transitory storage medium that stores the program thereon. A manufacturing method according to an aspect includes a coupling step and a carrying step. The coupling step includes coupling at least one functional module, selected from a plurality of functional modules, to a carrier 20. Each of the plurality of functional modules provides a predetermined function for one or more manufacturing apparatuses 11. Each of the one or more manufacturing apparatuses 11 performs predetermined work on a board. The carrying step includes making the carrier 20 carry the at least one functional module selected from the plurality of functional modules and coupled to the carrier 20. A control method according to another aspect includes a selecting step and a carrying instructing step. The selecting step includes selecting at least one functional module, selected from a plurality of functional modules, as a burden 40. The carrying instructing step includes outputting a carry instruction, instructing that the burden 40 be carried, to the carrier 20. A (computer) program according to still another aspect is designed to cause one or more processors to perform either the manufacturing method or control method described above.

Next, variations of the exemplary embodiment will be enumerated one after another. Note that the variations to be described below may be adopted in combination as appropriate.

The control system 30 (including the first controller 31, the second controller 32, and the integrated controller 33) and the carrier 20 according to the present disclosure each include a computer system. The computer system may include, as principal hardware components, a processor and a memory. The functions of the control system 30 and carrier 20 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive, any of which is readable for the computer system. The processor of the computer system may be made up of a single or a plurality of electronic circuits including a semiconductor integrated circuit (IC) or a large-scale integrated circuit (LSI). As used herein, the "integrated circuit" such as an IC or an LSI is called by a different name depending on the degree of integration thereof. Examples of the integrated circuits include a system LSI, a very-large-scale integrated circuit (VLSI), and an ultra-large-scale integrated circuit (ULSI). Optionally, a field-programmable gate array (FPGA) to be programmed after an LSI has been fabricated or a reconfigurable logic device allowing the connections or circuit sections inside of an LSI to be reconfigured may also be adopted as the processor. Those electronic circuits may be either integrated together on a single chip or distributed on multiple chips, whichever is appropriate. Those multiple chips may be aggregated together in a single device or distributed in multiple devices without limitation. As used herein, the "computer system" includes a microcontroller including one or more processors and one or more memories. Thus, the microcontroller may also be implemented as a single or a plurality of electronic circuits including a semiconductor integrated circuit or a large-scale integrated circuit.

Also, in the embodiment described above, the plurality of functions of the first controller 31, the second controller 32, and the integrated controller 33 are integrated together in a single housing. However, this is not an essential configuration for any of the first controller 31, the second controller 32, and the integrated controller 33. Alternatively, those constituent elements of the first controller 31, the second controller 32, and the integrated controller 33 may be distributed in multiple different housings. Still alternatively, at least some functions of the first controller 31, the second controller 32, and the integrated controller 33 may be implemented as a cloud computing system as well. Conversely, at least some of the plurality of functions of the control system 30 distributed in multiple devices may be integrated together in a single housing.

(3.1) First Variation

A carrier 20A included in a manufacturing system 1 according to a first variation will be described with reference to FIGS. 10-13. The carrier 20A includes a reflective sensor 542 to transmit a probe signal and detect an object based on a result of reception of a reflected signal generated by having the probe signal reflected from the object. In addition, the carrier 20A adjusts, based on a result of detection by the reflective sensor 542, a relative position with respect to at least one of the functional module or the manufacturing apparatus 11. In these respects, the first variation is different from the exemplary embodiment described above. In the following description, any constituent element of this first variation, having the same function as a counterpart of the embodiment described above, will be designated by the same reference numeral as that counterpart's, and description thereof will be omitted herein.

In the first variation, the carrier 20A includes a body 23A, of which the dimension in the forward/backward direction is larger than its dimension in the rightward/leftward direction. However, the shape of the body 23 may be changed as appropriate according to the type of functional module to carry, for example. The lower surface of the body 23A is provided with the drive wheels 21 and the auxiliary wheels 22. The carrier 20A travels on the traveling surface on the drive wheels 21 and the auxiliary wheels 22.

One surface (e.g., a rear surface) of the body 23A in the forward/backward direction is provided with the reflective sensor 542 at a middle in the rightward/leftward direction. The reflective sensor 542 transmits a probe signal such as a laser beam backward, and detects an object based on a result of reception of a reflected signal generated by having the probe signal reflected from the object. When receiving any reflected signal, the reflective sensor 542 detects the presence of an object in the direction in which the probe signal has been transmitted. On the other hand, when receiving no reflected signal, the reflective sensor 542 detects the absence of an object from the direction in which the probe signal has been transmitted.

Figure 10:
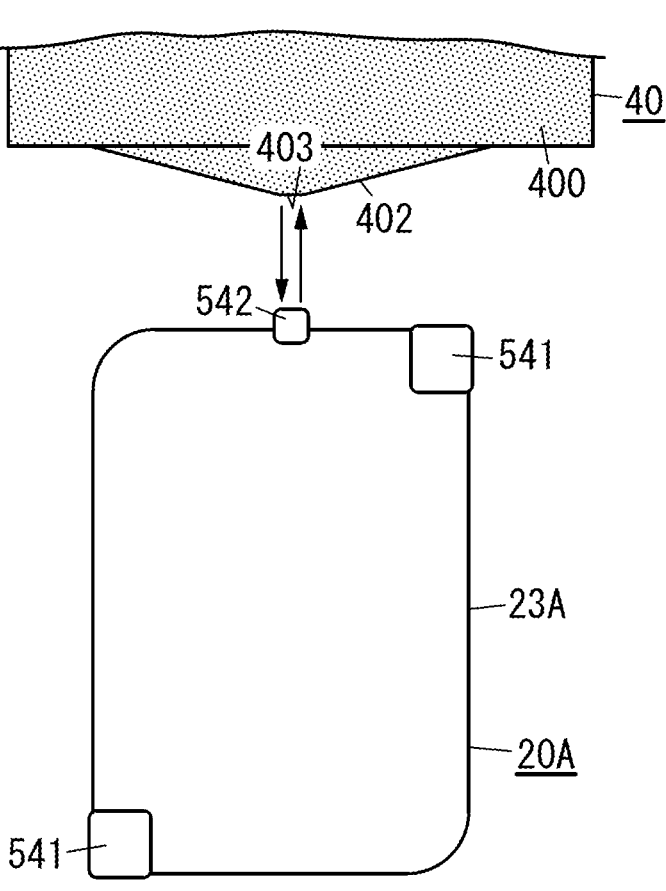
FIG. 10 is a schematic plan view of the carrier.
Figure 11:
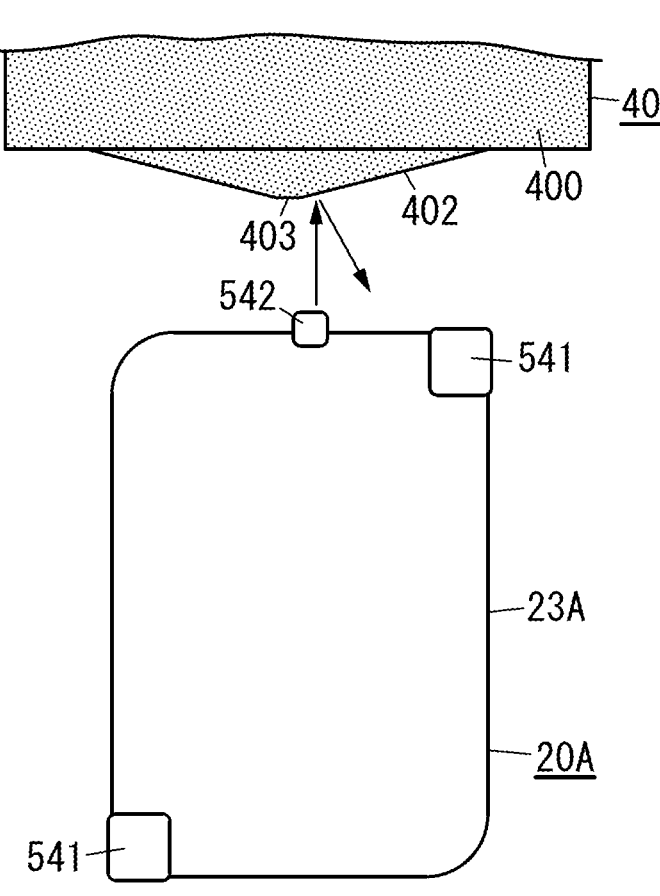
FIG. 11 is a schematic plan view of the carrier.

In this case, in a situation where the burden 40 has a trapezoidal projection 402, of which the vertex has a flat surface 403, if the flat surface 403 is misaligned in the rightward/leftward direction with the reflective sensor 542 as shown in FIG. 11, then the reflective sensor 542 cannot receive the light reflected from the burden 40, and therefore, cannot detect the presence of the burden 40. On the other hand, if the flat surface 403 is aligned in the rightward/leftward direction with the reflective sensor 542 as shown in FIG. 10, then the reflective sensor 542 may receive the light reflected from the burden 40, and therefore, may detect the presence of the burden 40. Thus, moving the carrier 20A to a position where the reflective sensor 542 may receive the reflected signal from the flat surface 403 enables accurately adjusting the relative position of the carrier 20A with respect to the burden 40 in the rightward/leftward direction.

Figure 12:
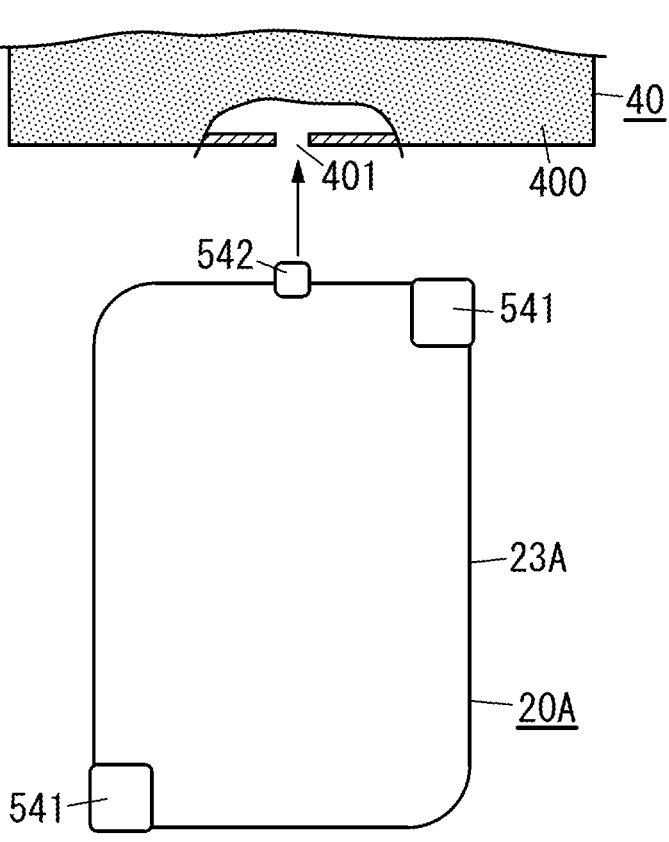
FIG. 12 is a schematic plan view of the carrier.

Note that in a situation where a surface of the body 400 of the burden 40 has a hole 401 as shown in FIG. 12, if the reflective sensor 542 is misaligned in the rightward/leftward direction with the hole 401, then the reflective sensor 542 may detect the presence of the burden 40. On the other hand, if the reflective sensor 542 is aligned in the rightward/leftward direction with the hole 401, then the reflective sensor 542 cannot detect the presence of the burden 40. Thus, moving the carrier 20A to a position where the reflective sensor 542 cannot receive the reflected signal enables accurately adjusting the relative position of the carrier 20A with respect to the burden 40 in the rightward/leftward direction.

Figure 13:
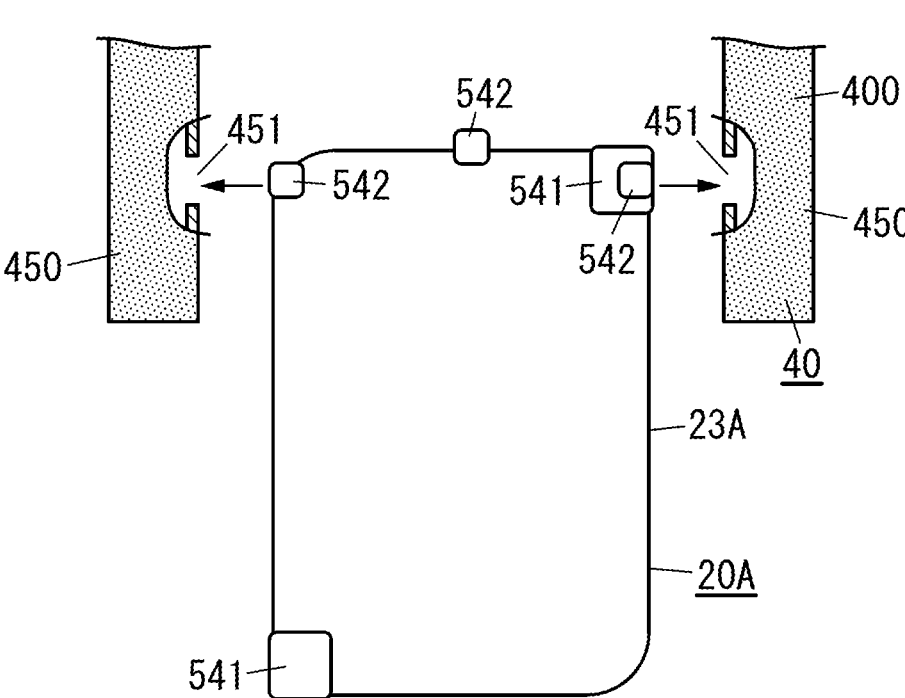
FIG. 13 is a schematic plan view of the carrier.

Also, further providing the right and left side surfaces of the carrier 20A with additional reflective sensors 542 as shown in FIG. 13 enables the carrier 20A to accurately adjust the relative position of the carrier 20A with respect to the burden 40 in the forward/backward direction as well. The burden 40 includes two arms 450 arranged on the right and left sides of the carrier 20A. The inner side surface of each of these two arms 450 has a hole 451 at the same position in the forward/backward direction. In this case, if the right and left reflective sensors 542 are misaligned in the forward/backward direction with the holes 451, the reflective sensors 542 may detect the presence of the burden 40. On the other hand, if the right and left reflective sensors 542 are aligned in the forward/backward direction with the holes 451, the reflective sensors 542 cannot detect the presence of the burden 40. Thus, moving the carrier 20A to a position where the right and left reflective sensors 542 cannot receive the reflected signal enables accurately adjusting the relative position of the carrier 20A with respect to the burden 40 in the forward/backward direction.

In the foregoing description of the first variation, the carrier 20A adjusts its relative position with respect to the functional module (burden 40) based on a result of detection by the reflective sensor 542. Alternatively, the carrier 20A may adjust its relative position with respect to a manufacturing apparatus 11. Still alternatively, the carrier 20A may adjust both its relative position with respect to the functional module and its relative position with respect to the manufacturing apparatus 11.

(3.2) Other Variations

In the exemplary embodiment described above, the control system 30 makes the carrier 20 perform both first carrying work of carrying a functional module to the manufacturing apparatus 11 at the destination and second carrying work of carrying a functional module, which is currently located at a place where the functional module may provide a predetermined function for the manufacturing apparatus 11, to somewhere else (such as the preparatory area A3). However, the carrier 20 does not have to perform both the first carrying work and the second carrying work. Alternatively, either the first carrying work or the second carrying work may be performed by either the worker or another carrier robot. That is to say, the control system 30 only needs to make the carrier 20 perform at least one of the first carrying work or the second carrying work, thus providing a carrier system to carry a burden 40 using the carrier 20.

Also, in the exemplary embodiment described above, a single carrier 20 is supposed to carry a single burden 40. Alternatively, a single carrier 20 may be made to carry a plurality of burdens 40. Still alternatively, a plurality of carriers 20 may cooperate with each other in carrying either a single burden 40 or a plurality of burdens 40.

Furthermore, in the exemplary embodiment described above, each of the manufacturing apparatuses 11 that form the mounting line 10 may perform, even in a state where no functional module is coupled to the manufacturing apparatus 11, predetermined work on the board using parts or a material refilling a stocker. That is to say, the manufacturing apparatus 11 includes a stocker for stocking the parts or material to be fed by a functional module and may perform predetermined processing on the board by using the parts or material refilling the stocker. Thus, the manufacturing apparatus 11 may perform predetermined work on the board even in a state where no functional module is coupled to the manufacturing apparatus 11. This allows the manufacturing apparatus 11 to perform the predetermined work on the board even in the interval during which the stocker is refilled by the functional module with the parts or the material, thus reducing the chances of the mounting line 10 coming to a halt suddenly.

Furthermore, in the exemplary embodiment described above, the coupling portion 29 for coupling the carrier 20 and the burden 40 to each other is configured as the grasping portions 24 for grasping the graspable portions 420 of the burden 40. However, the coupling portion 29 does not have to be the grasping portions 24 but may also be configured to couple the carrier 20 and the burden 40 to each other by any means other grasping. For example, the coupling portion 29 may also couple the burden 40 to the carrier 20 by catching a part of the burden 40 with magnetic force generated by an electromagnet, for example. In that case, the coupling portion 29 and a ferromagnetic member provided for the burden 40 may be selectively coupled and decoupled by making the control unit 51 control a current flowing through the electromagnet serving as the coupling portion 29. In addition, the number and shape of the coupling portions 29 provided for the carrier 20 may be changed as appropriate. Furthermore, in the exemplary embodiment described above, the burden 40 is directly coupled to the carrier 20. Alternatively, the burden 40 may also be coupled to the carrier 20 indirectly (i.e., via either a single member or a plurality of members).

Furthermore, in the exemplary embodiment described above, the carrier 20 carries the burden 40 either by towing the burden 40 with the carrier 20 traveling ahead of the burden 40 or by pushing the burden 40 with the burden 40 traveling ahead of the carrier 20. However, these are not the only ways of carrying the burden 40. Alternatively, the carrier 20 may also carry the burden 40 with the burden 40 lifted (i.e., with the burden 40 suspended over the traveling surface B1). That is to say, the carrier 20 may include a coupling portion for coupling the burden 40 to itself to carry the burden 40 while towing the burden 40, pushing the burden 40 from behind the burden 40, or lifting the burden 40.

(Recapitulation)

As can be seen from the foregoing description, a manufacturing system (1) according to a first aspect includes one or more manufacturing apparatuses (11), a carrier (20), and a control system (30). Each of the one or more manufacturing apparatuses (11) performs predetermined work on a board. The carrier (20) carries a burden (40). The control system (30) controls carrying work by the carrier (20). The burden (40) includes a plurality of functional modules. Each of the plurality of functional modules provides a predetermined function for the one or more manufacturing apparatuses (11). The carrier (20) includes a coupling portion (29) to be coupled to any of the plurality of functional modules. The control system (30) has at least one functional module, selected from the plurality of functional modules and coupled to the coupling portion (29), carried by the carrier (20).

This aspect enables reducing the number of carriers (20) to be used by the manufacturing system (1).

In a manufacturing system (1) according to a second aspect, which may be implemented in conjunction with the first aspect, the control system (30) makes, in a predetermined state, the carrier (20) decouple a first functional module selected from the plurality of functional modules and carry a second functional module selected from the plurality of functional modules except the first functional module. The predetermined state is a state where the carrier (20) has carried the first functional module to the one or more manufacturing apparatuses (11) and the first functional module is currently located at a place where the first functional module is ready to provide the predetermined function for the one or more manufacturing apparatuses (11).

This aspect enables reducing the number of carriers (20) to be used by the manufacturing system (1).

A manufacturing system (1) according to a third aspect, which may be implemented in conjunction with the first or second aspect, includes a plurality of the carriers (20). The plurality of the carriers (20) includes a first carrier (20) and a second carrier (20). The control system (30) has the at least one functional module being carried by the first carrier (20) decoupled from the first carrier (20) and makes the second carrier (20) carry the at least one functional module decoupled from the first carrier (20).

This aspect enables reducing the number of carriers (20) to be used by the manufacturing system (1).

In a manufacturing system (1) according to a fourth aspect, which may be implemented in conjunction with any one of the first to third aspects, the control system (30)

makes the carrier (20) carry a functional module selected from the plurality of functional modules.

This aspect enables reducing the number of carriers (20) to be used by the manufacturing system (1).

In a manufacturing system (1) according to a fifth aspect, which may be implemented in conjunction with the fourth aspect, the control system (30) selects, by reference to information about the work to be performed by the one or more manufacturing apparatuses (11) and using a learned model generated by machine learning, the functional module to be carried by the carrier (20).

This aspect enables reducing the number of carriers (20) to be used by the manufacturing system (1).

In a manufacturing system (1) according to a sixth aspect, which may be implemented in conjunction with any one of the first to fifth aspects, when there arises any need to perform work of carrying a priority module, having a higher priority than the at least one functional module being currently carried by the carrier (20) and belonging to the plurality of functional modules, the control system (30) instructs the carrier (20) to give a higher priority to carrying the priority module than carrying the at least one functional module being currently carried.

This aspect enables reducing the number of carriers (20) to be used by the manufacturing system (1).

In a manufacturing system (1) according to a seventh aspect, which may be implemented in conjunction with any one of the first to sixth aspects, the carrier (20) is supplied, in a state where the at least one functional module being currently carried is providing the predetermined function for the one or more manufacturing apparatuses (11), with energy by the one or more manufacturing apparatuses (11).

This aspect enables reducing the number of carriers (20) to be used by the manufacturing system (1).

In a manufacturing system (1) according to an eighth aspect, which may be implemented in conjunction with any one of the first to seventh aspects, the at least one functional module is supplied with energy by the carrier (20) while being carried by the carrier (20).

This aspect enables reducing the number of carriers (20) to be used by the manufacturing system (1).

In a manufacturing system (1) according to a ninth aspect, which may be implemented in conjunction with any one of the first to eighth aspects, the at least one functional module performs predetermined preparatory work while being carried by the carrier (20).

This aspect enables reducing the number of carriers (20) to be used by the manufacturing system (1).

In a manufacturing system (1) according to a tenth aspect, which may be implemented in conjunction with any one of the first to ninth aspects, the coupling portion (29) included in the carrier (20) is couplable to two or more functional modules selected from the plurality of functional modules.

This aspect enables reducing the number of carriers (20) to be used by the manufacturing system (1).

In a manufacturing system (1) according to an eleventh aspect, which may be implemented in conjunction with any one of the first to tenth aspects, the carrier (20) includes a reflective sensor (542) to transmit a probe signal and detect an object based on a result of reception of a reflected signal generated by having the probe signal reflected from the object. The carrier (20) adjusts, based on a result of detection by the reflective sensor (542), its relative position with respect to the at least one functional module and/or the one or more manufacturing apparatuses (11).

This aspect enables reducing the number of carriers (20) to be used by the manufacturing system (1).

In a manufacturing system (1) according to a twelfth aspect, which may be implemented in conjunction with any one of the first to eleventh aspects, the carrier (20) includes a magnetic sensor (543) to detect, by magnetism, a guidance line provided on a traveling surface (B1) on which the carrier (20) is going to travel. The carrier (20) travels on the traveling surface (B1) based on a result of detection by the magnetic sensor (543).

This aspect enables reducing the number of carriers (20) to be used by the manufacturing system (1).

In a manufacturing system (1) according to a thirteenth aspect, which may be implemented in conjunction with any one of the first to twelfth aspects, the one or more manufacturing apparatuses (11) may each perform the predetermined work on the board by using parts or a material refilling a stocker while none of the plurality of functional modules has been coupled to any of the one or more manufacturing apparatuses (11).

This aspect enables reducing the number of carriers (20) to be used by the manufacturing system (1).

In a manufacturing system (1) according to a fourteenth aspect, which may be implemented in conjunction with any one of the first to thirteenth aspects, the control system (30) makes the carrier (20) perform at least one of first carrying work or second carrying work. The first carrying work includes carrying any of the plurality of functional modules to the one or more manufacturing apparatuses (11) at a destination. The second carrying work includes carrying any of the functional modules, currently located at a place where the functional module is ready to provide the predetermined function for the one or more manufacturing apparatuses (11), to another place.

This aspect enables reducing the number of carriers (20) to be used by the manufacturing system (1).

In a manufacturing system (1) according to a fifteenth aspect, which may be implemented in conjunction with any one of the first to fourteenth aspects, the one or more manufacturing apparatuses (11) include a mounter to mount parts onto the board. The plurality of functional modules includes at least one of a parts feeding module (41), a tray feeding module (42), a waste collecting module (44), a board loading module, a board unloading module, a maintenance module, or a feeder refill module. The parts feeding module (41) feeds the parts to the mounter. The tray feeding module (42) feeds a tray, on which the parts are placed, to the mounter. The waste collecting module (44) collects waste discharged from the one or more manufacturing apparatuses (11). The board loading module loads the board onto the one or more manufacturing apparatuses (11). The board unloading module unloads the board from the one or more manufacturing apparatuses (11). The maintenance module provides at least one of the function of providing materiel for use to manufacture the board for the one or more manufacturing apparatuses (11), the function of removing parts to be maintained from the one or more manufacturing apparatuses (11), or the function of bringing maintained parts back to the one or more manufacturing apparatuses (11). The feeder refill module refills the one or more manufacturing apparatuses (11) with a feeder.

This aspect enables reducing the number of carriers (20) to be used by the manufacturing system (1).

A manufacturing method according to a sixteenth aspect includes a coupling step and a carrying step. The coupling step includes coupling at least one functional module, selected from a plurality of functional modules, to a carrier (20). Each of the plurality of functional modules provides a predetermined function for one or more manufacturing apparatuses (11). Each of the one or more manufacturing apparatuses (11) performs predetermined work on a board. The carrying step includes making the carrier (20) carry the at least one functional module selected from the plurality of functional modules and coupled to the carrier (20).

This aspect enables reducing the number of carriers (20) to be used by the manufacturing system (1).

A control system according to a seventeenth aspect includes a selection unit (331) and a carrying instruction unit (332). The selection unit (331) selects, from a plurality of functional modules, at least one functional module as a burden (40). Each of the plurality of functional modules provides a predetermined function for one or more manufacturing apparatuses (11). Each of the one or more manufacturing apparatuses (11) performs predetermined work on a board. The carrying instruction unit (332) outputs a carry instruction, instructing that the burden (40) be carried, to the carrier (20).

This aspect enables reducing the number of carriers (20) to be used by the manufacturing system (1).

A control method according to an eighteenth aspect includes a selecting step and a carrying instructing step. The selecting step includes selecting, from a plurality of functional modules, at least one functional module as a burden (40). Each of the plurality of functional modules provides a predetermined function for one or more manufacturing apparatuses (11). Each of the one or more manufacturing apparatuses (11) performs predetermined work on a board. The carrying instructing step includes outputting a carry instruction, instructing that the burden (40) be carried, to the carrier (20).

This aspect enables reducing the number of carriers (20) to be used by the manufacturing system (1).

Note that these are not the only aspects of the present disclosure but various configurations (including variations) of the manufacturing system (1) according to the exemplary embodiment described above may also be implemented as a manufacturing method, a (computer) program, or a non-transitory storage medium that stores the program thereon. Various configurations (including variations) of the control system (30) according to the exemplary embodiment described above may also be implemented as a control method for the control system (30) to control carrying work by the carrier (20), a (computer) program, or a non-transitory storage medium that stores the program thereon.

Note that the constituent elements according to the second to fifteenth aspects are not essential constituent elements for the manufacturing system (1) but may be omitted as appropriate.

REFERENCE SIGNS LIST

1 Manufacturing System
10 Mounting Line
11 Manufacturing Apparatus
20 Carrier
29 Coupling Portion
30 Control System
40 Burden

What is claimed is:

1. A manufacturing system comprising:
one or more manufacturing apparatuses, each being configured to perform predetermined work on a board;
a carrier configured to carry a burden; and
a control system configured to control carrying work by the carrier, the burden including a plurality of functional modules, each of the plurality of functional modules being configured to provide a predetermined function for the one or more manufacturing apparatuses,
the carrier including a coupling portion to be coupled to any of the plurality of functional modules,
the control system being configured to have at least one functional module, selected from the plurality of functional modules and coupled to the coupling portion, carried by the carrier,
the one or more manufacturing apparatuses including a mounter configured to mount parts onto the board,
the plurality of functional modules including at least one of:
a parts feeding module configured to feed the parts;
a tray feeding module configured to feed a tray, on which the parts are placed, to the mounter;
a waste collecting module configured to collect waste discharged from the one or more manufacturing apparatuses;
a board loading module configured to load the board onto the one or more manufacturing apparatuses;
a board unloading module configured to unload the board from the one or more manufacturing apparatuses;
a maintenance module configured to provide at least one of the function of providing materiel for use to manufacture the board for the one or more manufacturing apparatuses, the function of removing parts to be maintained from the one or more manufacturing apparatuses, or the function of bringing maintained parts back to the one or more manufacturing apparatuses; or
a feeder refill module configured to refill the one or more manufacturing apparatuses with a feeder.

2. The manufacturing system of claim 1, wherein
the control system is configured to, in a state where the carrier has carried a first functional module selected from the plurality of functional modules to the one or more manufacturing apparatuses and the first functional module is currently located at a place where the first functional module is ready to provide the predetermined function for the one or more manufacturing apparatuses, make the carrier decouple the first functional module and instead carry a second functional module selected from the plurality of functional modules except the first functional module.

3. The manufacturing system of claim 1, further comprising a plurality of the carriers one of which is the carrier, wherein
the plurality of the carriers includes a first carrier and a second carrier, and
the control system is configured to have the at least one functional module being carried by the first carrier decoupled from the first carrier and make the second carrier carry the at least one functional module decoupled from the first carrier.

4. The manufacturing system of claim 1, wherein
the control system is configured to make the carrier carry a functional module selected from the plurality of functional modules.

5. The manufacturing system of claim 4, wherein
the control system is configured to select, by reference to information about the work to be performed by the one or more manufacturing apparatuses and using a learned model generated by machine learning, the functional module to be carried by the carrier.

6. The manufacturing system of claim 1, wherein the control system is configured to, when there arises any need to perform work of carrying a priority module, having a higher priority than the at least one functional module being currently carried by the carrier and belonging to the plurality of functional modules, instruct the carrier to give a higher priority to carrying the priority module than carrying the at least one functional module being currently carried.

7. The manufacturing system of claim 1, wherein the carrier is configured to, in a state where the at least one functional module being currently carried is providing the predetermined function for the one or more manufacturing apparatuses, be supplied with energy by the one or more manufacturing apparatuses.

8. A manufacturing system comprising:

one or more manufacturing apparatuses, each being configured to perform predetermined work on a board;

a carrier configured to carry a burden; and a control system configured to control carrying work by the carrier, the burden including a plurality of functional modules, each of the plurality of functional modules being configured to provide a predetermined function for the one or more manufacturing apparatuses, the carrier including a coupling portion to be coupled to any of the plurality of functional modules, the control system being configured to have at least one functional module, selected from the plurality of functional modules and coupled to the coupling portion, carried by the carrier, the at least one functional module being configured to be supplied with energy by the carrier while being coupled to the carrier.

9. The manufacturing system of claim 1, wherein the at least one functional module is configured to perform predetermined preparatory work while being carried by the carrier.

10. The manufacturing system of claim 1, wherein the coupling portion included in the carrier is couplable to two or more functional modules selected from the plurality of functional modules.

11. The manufacturing system of claim 1, wherein the carrier includes a reflective sensor configured to transmit a probe signal and detect an object based on a result of reception of a reflected signal generated by having the probe signal reflected from the object, and the carrier is configured to adjust, based on a result of detection by the reflective sensor, its relative position with respect to the at least one functional module and/or the one or more manufacturing apparatuses.

12. The manufacturing system of claim 1, wherein the carrier includes a magnetic sensor configured to detect, by magnetism, a guidance line provided on a traveling surface on which the carrier is going to travel, and the carrier is configured to travel on the traveling surface based on a result of detection by the magnetic sensor.

13. A manufacturing system comprising:

one or more manufacturing apparatuses, each being configured to perform predetermined work on a board;

a carrier configured to carry a burden; and a control system configured to control carrying work by the carrier, the burden including a plurality of functional modules, each of the plurality of functional modules being configured to provide a predetermined function for the one or more manufacturing apparatuses, the carrier including a coupling portion to be coupled to any of the plurality of functional modules, the control system being configured to have at least one functional module, selected from the plurality of functional modules and coupled to the coupling portion, carried by the carrier, the one or more manufacturing apparatuses being configured to perform the predetermined work on the board by using parts or a material refilling a stocker while none of the plurality of functional modules has been coupled to any of the one or more manufacturing apparatuses.

14. The manufacturing system of claim 1, wherein the control system is configured to make the carrier perform at least one of first carrying work of carrying any of the plurality of functional modules to the one or more manufacturing apparatuses at a destination or second carrying work of carrying any of the plurality of functional modules, currently located at a place where the functional module is ready to provide the predetermined function for the one or more manufacturing apparatuses, to another place.

\* \* \* \* \*